US010658014B2

(12) United States Patent
Lee et al.

(10) Patent No.: US 10,658,014 B2
(45) Date of Patent: May 19, 2020

(54) MEMORY DEVICE WITH MEMORY CELL BLOCKS, BIT LINE SENSE AMPLIFIER BLOCKS, AND CONTROL CIRCUIT CONNECTED TO BIT LINE SENSE AMPLIFIER BLOCKS TO CONTROL CONSTANT LEVELS OF CURRENTS SUPPLIED TO SENSING DRIVING VOLTAGE LINES

(71) Applicant: SAMSUNG ELECTRONICS CO., LTD., Suwon-si, Gyeonggi-Do (KR)

(72) Inventors: Min-su Lee, Seongnam-si (KR); Jong-cheol Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/941,877

(22) Filed: Mar. 30, 2018

(65) Prior Publication Data

US 2019/0096446 A1  Mar. 28, 2019

(30) Foreign Application Priority Data

Sep. 27, 2017  (KR) .................... 10-2017-0125412

(51) Int. Cl.
*G11C 7/08*     (2006.01)
*G11C 11/4094*  (2006.01)
(Continued)

(52) U.S. Cl.
CPC ............. *G11C 7/08* (2013.01); *G11C 7/062* (2013.01); *G11C 7/065* (2013.01); *G11C 7/12* (2013.01);
(Continued)

(58) Field of Classification Search
CPC ........... G11C 7/08; G11C 7/062; G11C 7/065; G11C 11/4091
See application file for complete search history.

(56) References Cited

U.S. PATENT DOCUMENTS 5,909,402 A * 6/1999 Joo .......................... G11C 7/06
                                                        365/189.07
6,198,350 B1   3/2001 Zarabadi
(Continued)

FOREIGN PATENT DOCUMENTS

KR   1020150015809   2/2015

OTHER PUBLICATIONS

Hee-Bok Kang, et al., "A Sense Amplifier Scheme with Offset Cancellation for Giga-bit DRAM", Journal of Semiconductor Technology and Science, vol. 7, No. 2, Jun. 2007, pp. 67-75.

*Primary Examiner* — Mushfique Siddique
(74) *Attorney, Agent, or Firm* — F. Chau & Associates, LLC

(57) ABSTRACT

A memory device includes memory cell blocks, bit line sense amplifier blocks, and a control circuit connected to one or more of the bit line sense amplifier blocks arranged between the memory cell blocks. The control circuit controls levels of currents respectively supplied to a first sensing driving voltage line and a second sensing driving voltage line driving bit line sense-amplifiers, to be constant. A first sensing driving control signal and/or a second sensing driving control signal, output from the sensing-matching control circuit is provided to the bit line sense amplifiers in all of the bit line sense amplifier blocks, so that the bit line sense amplifiers are constantly driven based on the constant levels of currents supplied to the first sensing driving voltage line and the second sensing driving voltage line.

17 Claims, 15 Drawing Sheets

(51) Int. Cl.
    *G11C 11/4091*   (2006.01)
    *G11C 7/06*      (2006.01)
    *G11C 7/12*      (2006.01)

(52) U.S. Cl.
    CPC ...... *G11C 11/4091* (2013.01); *G11C 11/4094* (2013.01)

(56) References Cited

U.S. PATENT DOCUMENTS

| | | | |
|---|---|---|---|
| 6,205,071 B1 * | 3/2001 | Ooishi | G11C 7/065 |
| | | | 365/205 |
| 6,215,331 B1 | 4/2001 | Setty et al. | |
| 6,462,584 B1 * | 10/2002 | Proebsting | G11C 7/065 |
| | | | 257/E21.659 |
| 6,650,184 B2 | 11/2003 | Jaussi | |
| 9,202,531 B2 * | 12/2015 | Seo | G11C 7/065 |
| 9,378,781 B1 | 6/2016 | Jung et al. | |
| 9,444,406 B1 | 9/2016 | Perrott et al. | |
| 2002/0031032 A1 * | 3/2002 | Ooishi | G11C 5/143 |
| | | | 365/226 |
| 2003/0117874 A1 * | 6/2003 | Lee | G11C 7/06 |
| | | | 365/207 |
| 2005/0088881 A1 * | 4/2005 | Miki | G11C 5/14 |
| | | | 365/189.09 |
| 2006/0181917 A1 * | 8/2006 | Kang | G11C 7/065 |
| | | | 365/149 |
| 2008/0048737 A1 * | 2/2008 | Ito | H05B 33/0851 |
| | | | 327/109 |
| 2008/0219073 A1 * | 9/2008 | Kang | G11C 7/08 |
| | | | 365/210.12 |
| 2016/0093350 A1 | 3/2016 | Jung et al. | |

\* cited by examiner

MEMORY DEVICE WITH MEMORY CELL BLOCKS, BIT LINE SENSE AMPLIFIER BLOCKS, AND CONTROL CIRCUIT CONNECTED TO BIT LINE SENSE AMPLIFIER BLOCKS TO CONTROL CONSTANT LEVELS OF CURRENTS SUPPLIED TO SENSING DRIVING VOLTAGE LINES

CROSS-REFERENCE TO RELATED APPLICATION

This application claims priority under 35 U.S.C. 119 to Korean Patent Application No. 10-2017-0125412, filed on Sep. 27, 2017, in the Korean Intellectual Property Office, the disclosure of which is incorporated by reference in its entirety herein.

BACKGROUND

1. Technical Field

The inventive concept relates to a memory device, and more particularly, to a method and a memory device for constantly controlling sensing operations of bit line sense amplifiers.

2. Discussion of Related Art

Dynamic random-access memory (DRAM) is a type of random access semiconductor memory that stores each bit of data in cell capacitors of memory cells. The memory cells are connected to bit lines and complementary bit lines. When a read operation or a refresh operation is performed in a DRAM, a bit line sense amplifier senses and amplifies a voltage difference between the bit line and the complementary bit line. Semiconductor devices included in the bit line sense amplifier may have different characteristics, for example, different threshold voltages, among one another, due to process-voltage-temperature (PVT) variations. Thus, a gain change may occur in the bit line sense amplifier and distribution of sensing characteristics may be increased. However, when the distribution of the sensing characteristics is increased, timing performance of the DRAM may be degraded.

SUMMARY

At least one embodiment of the inventive concept provides a method and a memory device for constantly controlling sensing operations of bit line sense amplifiers.

According to an exemplary embodiment of the inventive concept, there is provided a memory device including a plurality of memory cell blocks including a plurality of memory cells, a plurality of bit line sense amplifier blocks arranged between the memory cell blocks and including bit line sense amplifiers performing sensing operations for sensing and amplifying data of the memory cells, and a sensing-matching control circuit connected to one or more of the bit line sense amplifier blocks and determining levels of currents respectively supplied to a first sensing driving voltage line and a second sensing driving voltage line, wherein the first sensing driving voltage line and the second sensing driving voltage line are connected to the bit line sense amplifiers of the one or more bit line sense amplifier blocks, to which the sensing-matching control circuit is connected, wherein the bit line sense amplifiers of the one or more bit line sense amplifier blocks are driven based on the levels of currents of the first and second sensing driving voltage lines, the levels of currents being determined by the sensing-matching control circuit.

According to an exemplary embodiment of the inventive concept, there is provided a memory device including a plurality of memory cell blocks including a plurality of memory cells, a plurality of bit line sense amplifier blocks arranged between the memory cell blocks and including bit line sense amplifiers performing operations of removing an offset voltage between a bit line and a complementary bit line, to which the memory cells are connected, and sensing and amplifying a voltage difference between the bit line and the complementary bit line, and a sensing-matching control circuit connected to one or more of the bit line sense amplifier blocks and determining levels of currents respectively supplied to a first sensing driving voltage line and a second sensing driving voltage line, wherein the first sensing driving voltage line and the second sensing driving voltage line are connected to the bit line sense amplifiers of the one or more bit line sense amplifier blocks, to which the sensing-matching control circuit is connected, wherein the bit line sense amplifiers of the one or more bit line sense amplifier blocks are driven based on the levels of currents of the first and second sensing driving voltage lines, the levels of currents being determined by the sensing-matching control circuit.

According to an exemplary embodiment of the inventive concept, there is provided a method of controlling bit line sense amplifiers connected between a first sensing driving voltage line and a second sensing driving voltage line and performing sensing operations for sensing and amplifying data of memory cells, the method including a control circuit precharging a bit line and a complementary bit line connected to the bit line sense amplifiers, supplying a first current to a first internal voltage line, the control circuit comparing a level of a voltage of the first internal voltage line with a level of a first reference voltage, the control circuit generating a first sensing driving control signal when the level of the voltage of the first internal voltage line and the level of the first reference voltage are equal to each other, based on a result of the comparison, the control circuit determining a level of current supplied to the first sensing driving voltage line in response to the first sensing driving control signal, and the control circuit driving the bit line sense amplifiers based on the determined level of current of the first sensing driving voltage line.

According to an exemplary embodiment of the inventive concept, a memory device is provided that includes first and second memory cells, a bit line connected to the first memory cell, a complimentary bit line connected to the second memory cell, a first sense amplifier connected between the bit line and the complimentary bit line to supply a high level of voltage that is amplified in an operation of sensing and amplifying data of the memory cell, a second sense amplifier between the bit line and the complimentary bit line to supply a low level of voltage that is amplified in an operation of sensing and amplifying data of the memory cell; and a control circuit providing a first constant voltage to the first sense amplifier and a second constant voltage to the second sense amplifier.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Figure 1:
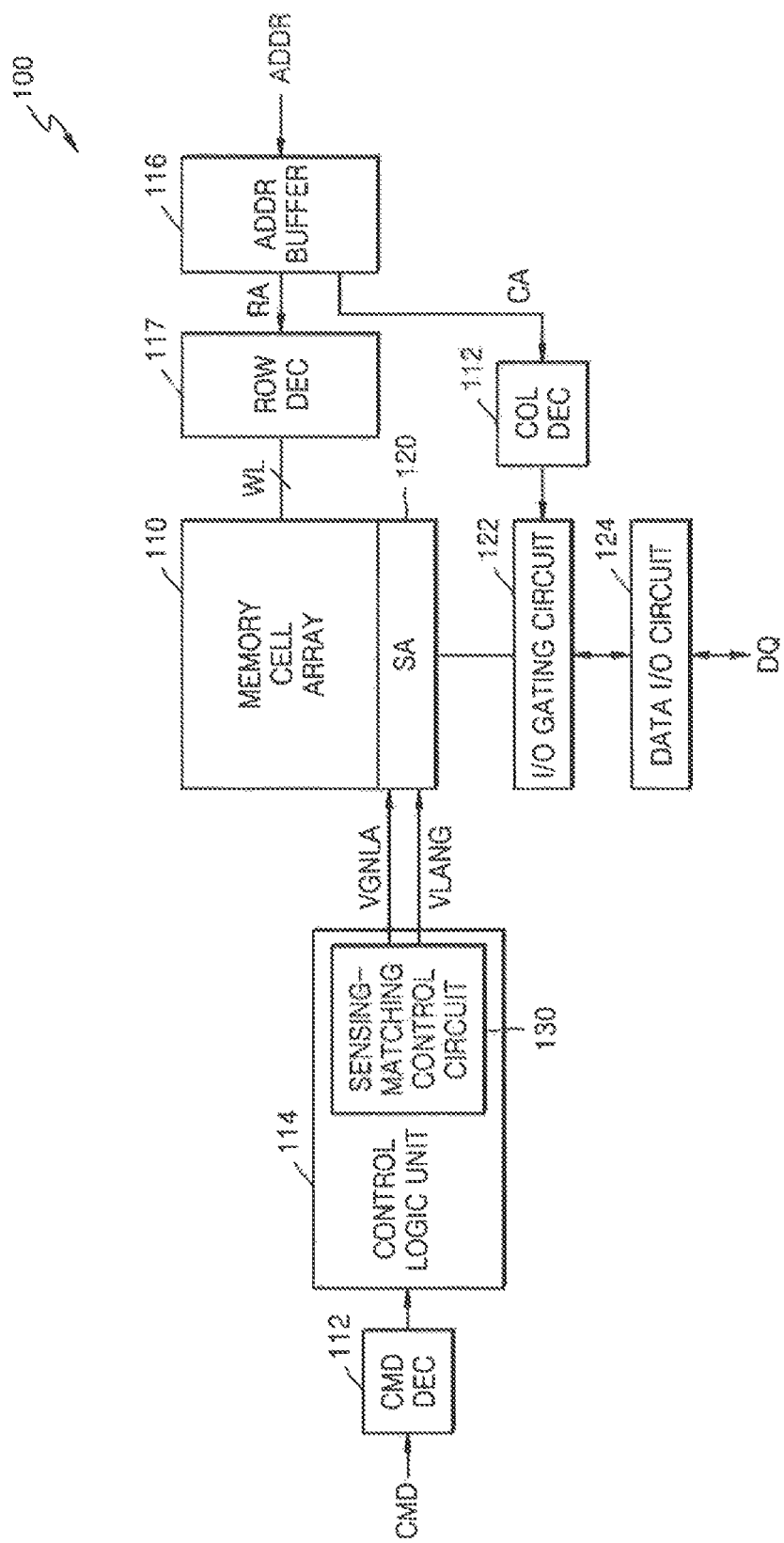
FIG. 1 is a block diagram of a memory device according to an exemplary embodiment of the inventive concept.

FIG. 1 is a block diagram of a memory device 100 according to an exemplary embodiment of the inventive concept.

Referring to FIG. 1, the memory device 100 may be a storage device based on a semiconductor device. For example, the memory device 100 may include volatile memories, such as dynamic random-access memory (DRAM), synchronous DRAM (SDRAM), double data rate SDRAM (DDR SDRAM), low power DDR SDRAM (LPDDR SDRAM), graphics DDR SDRAM (GDDR SDRAM), DDR2 SDRAM, DDR3 SDRAM, DDR4 SDRAM, thyristor RAM (TRAM), etc., and nonvolatile memories, such as phase-change random-access memory (RAM) (PRAM), magnetic RAM (MRAM), resistive RAM (RRAM), etc.

The memory device 100 receives a command CMD, an address ADDR, and control signals from an external device, for example, a central processing unit (CPU) or a memory controller, and may input or output data via data pads DQ. The memory device 100 includes a memory cell array 110, a command decoder 112 (e.g., a decoder circuit), a control logic 114 (e.g., a logic circuit), an address buffer 116 (e.g., a storage device), a row decoder 117 (e.g., a decoder circuit), a column decoder 118 (e.g., a decoder circuit), a sense amplifier block 120 (e.g., one or more sense amplifiers), an input and output gating circuit 122, and a data input and output (I/O) circuit 124.

The memory cell array 110 may include a plurality of memory cells provided in a matrix shape including rows and columns. The memory cell array 110 may include a plurality of word lines WL and a plurality of bit lines BL connected to the memory cells. The plurality of word lines WL may be connected to rows of the memory cells and the plurality of bit lines BL may be connected to columns of the memory cells.

The command decoder 112 may decode a row address strobe signal /RAS, a column address strobe signal /CAS, a chip selection signal /CS, or a write enable signal /WE received from the CPU or the memory controller, so that control signals corresponding to the command CMD may be generated in the control logic 114. The command CMD may include an active command, a read command, a write command, or a precharge command. The activate command may be used to select a particular bank or memory cell and activate a particular row so it can be later read or written.

The address buffer 116 receives the address ADDR from the CPU or the memory controller. The address ADDR includes a row address RA addressing the rows of the memory cell array 110 and a column address CA addressing the columns of the memory cell array 110. According to an embodiment, the command CMD and the address ADDR are provided to the memory device 100 via a command address bus. The command address bus may time-sequentially load the command CMD or the address ADDR. The address buffer 116 may transmit the row address RA to the row decoder 117 and the column address CA to the column decoder 118. For example, the command address bus may transmit the command CMD during a first time period and the address ADDR associated with the command at a second time period after the first time period.

The row decoder 117 may select any one of the plurality of word lines WL connected to the memory cell array 110. The row decoder 117 may decode the row address RA received from the address buffer 116, select any one word line WL corresponding to the row address RA, and activate the selected word line WL.

The column decoder 118 may select predetermined bit lines BL from among the plurality of bit lines BL of the memory cell array 110. The column decoder 118 may decode the column address CA received from the address buffer 116, generate a column selection signal CSL, and select the bit lines BL connected to the column selection signal CSL via the input and output gating circuit 122.

The sense amplifier block 120 may be connected to the bit lines BL of the memory cell array 110. The sense amplifier block 120 may sense a voltage change of the bit lines BL and may amplify and output the voltage change. The bit lines BL, the voltage change of which is sensed and amplified by the sense amplifier block 120, may be selected via the input and output gating circuit 122.

The input and output gating circuit 122 may include read data latches for storing data of the bit lines BL selected based on the column selection signal CSL, and a write driver for writing data in the memory cell array 110. The data stored in the read data latches may be provided to the data pads DQ via the data input and output circuit 124. The write data provided to the data input and output circuit 124 via the data pads DQ may be written in the memory cell array 110 via the write driver.

The control logic 114 includes a sensing-matching control circuit 130 for constantly controlling sensing operations of bit line sense amplifiers in the sense amplifier block 120. In an embodiment, the sensing-matching control circuit 130 controls constant levels of voltages to be supplied to a first sensing driving voltage line and a second sensing driving voltage line, respectively, connected to the bit line sense amplifiers, and outputs a first sensing driving control signal VGNLA and/or a second sensing driving control signal VLANG. The first sensing driving control signal VGNLA and/or the second sensing driving control signal VLANG of the sensing-matching control circuit 130 may allow all of the bit line sense amplifiers in the sense amplifier block 120 to be driven based on the constant first sensing driving voltage and/or the constant second sensing driving voltage, so that the bit line sense amplifiers constantly perform the sensing operations.

Figure 2:
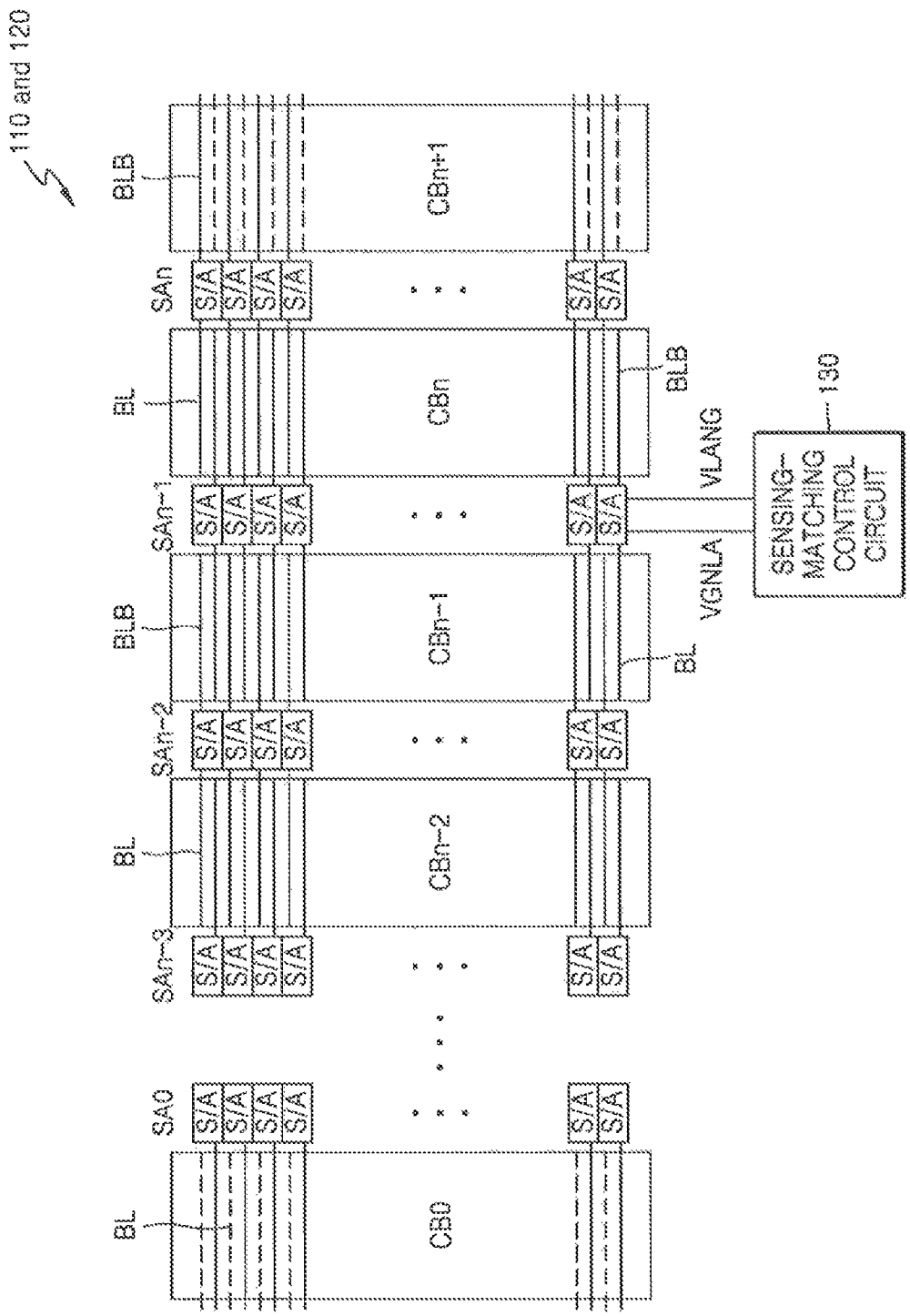
FIG. 2 is a detailed diagram of a memory cell array and a sense amplifier block of FIG. 1.

FIG. 2 is a detailed diagram of the memory cell array 110 and the sense amplifier block 120 of FIG. 1.

Referring to FIG. 2, the memory cell array 110 includes a plurality of memory cell blocks CB0 through CBn+1 (n is a natural number including 0). Bit line sense amplifier blocks SA0 through SAn (e.g., SA0, SAn-3, San-2, SAn-1, SAn) may be arranged between the plurality of memory cell blocks CB0 through CBn+1 (e.g., CB0, CBn-2, CBn-1, CBn, CBn+1). For example, the memory cell block CBn-1 and the memory cell block CBn may be arranged at both ends of the bit line sense amplifier block SAn-1. That is, at both sides of the bit line sense amplifier block SAn-1, the memory cell block CBn-1 and the memory cell block CBn may be arranged.

Each of the bit line sense amplifier blocks SA0 through SAn may include a plurality of bit line sense amplifiers S/A connected to bit lines BL and complementary bit lines BLB. The bit line sense amplifiers S/A may be repeatedly arranged in a direction in which the bit lines BL and the complementary bit lines BLB extend. The bit line BL and the complementary bit line BLB may form a pair, and the pair of the bit line BL and the complementary bit line BLB may be connected to each of the bit line sense amplifiers S/A. The bit line sense amplifiers S/A may be arranged in two bit line pitches.

One or more of the plurality of bit line sense amplifier blocks SA0 through SAn, for example, the bit line sense amplifier blocks SAk through SAm, may be connected to the sensing-matching control circuit 130. The sensing-matching control circuit 130 may control constant levels of currents to be supplied to a first sensing driving voltage line LA and a second sensing driving voltage line LAB, respectively, of the bit line sense amplifiers S/A in the bit line sense amplifier blocks SAk through SAm.

For example, it may be assumed that the number of the bit line sense amplifiers S/A included in the bit line sense amplifier blocks SAk through SAm is 2048. The sensing-matching control circuit 130 may supply constant levels of currents to the first sensing driving voltage line LA and the second sensing driving voltage line LAB of the 2048 bit line sense amplifiers S/A in the bit line sense amplifier blocks SAk through SAm. It is to be understood that operations of the 2048 bit line sense amplifiers S/A in the bit line sense amplifier blocks SAk through SAm may stochastically have similar patterns as operations of the bit line sense amplifiers S/A of the remaining bit line sense amplifier blocks (SA0 through SAn excluding SAk through SAm).

In an embodiment, the first and/or second sensing driving control signals VGNLA and/or VLANG (refer to FIG. 5) obtained by controlling constant levels of currents to be supplied to the first sensing driving voltage line LA and the second sensing driving voltage line LAB of the 2048 bit line sense amplifiers S/A in the bit line sense amplifier blocks SAk through SAm are directly provided to all of the bit line sense amplifier blocks SA0 through SAn. Constant levels of currents may be supplied to the first sensing driving voltage line LA and the second sensing driving voltage line LAB of the bit line sense amplifiers S/A in all the bit line sense amplifier blocks SA0 through SAn. That is, since all the bit line sense amplifiers S/A are driven based on the constant levels of currents supplied to the first and second sensing driving voltage lines LA and LAB, respectively, it may be predicted that the sensing operations of the bit line sense amplifiers S/A become constant. Also, even if device characteristics of the bit line sense amplifiers S/A vary, since the bit line sense amplifiers S/A are driven based on the constant levels of currents supplied to the first and second sensing driving voltage lines LA and LAB, respectively, distribution of sensing characteristics of the bit line sense amplifiers S/A may be reduced.

Figure 3:
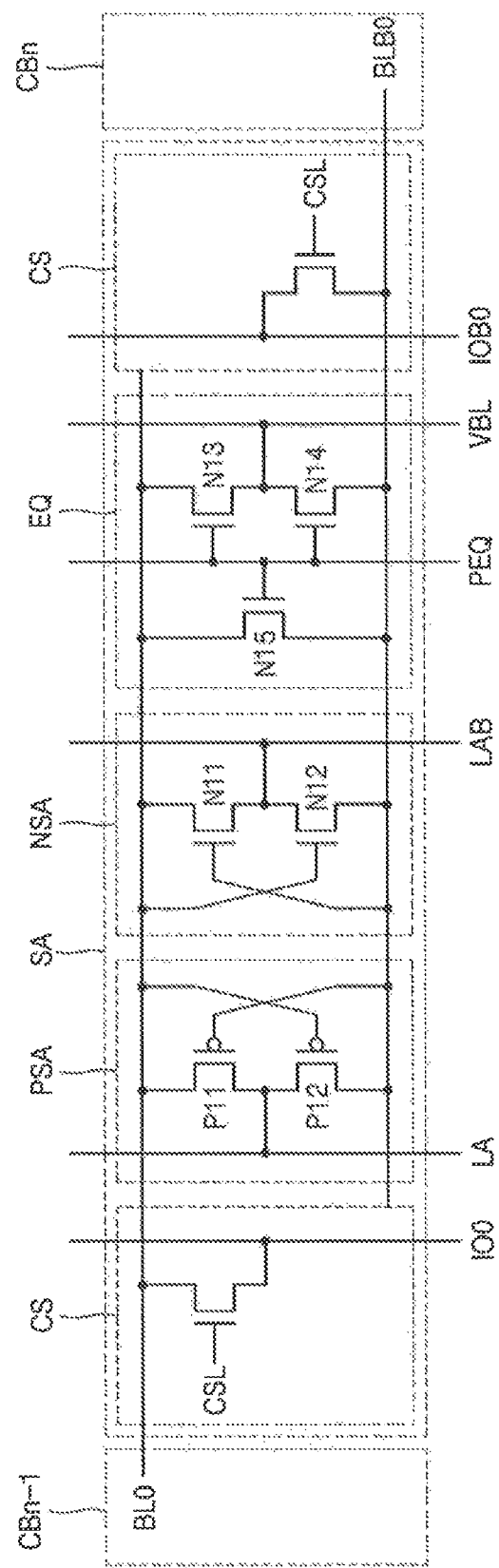
FIG. 3 is a diagram of circuits included in a bit line sense amplifier of FIG. 2.

FIG. 3 is a diagram of circuits included in the bit line sense amplifier S/A illustrated in FIG. 2. In FIG. 3, for convenience of explanation, it is assumed that the bit line sense amplifier S/A is arranged between the memory cell block CBn-1 and the memory cell block CBn.

Referring to FIG. 3, the bit line sense amplifier S/A includes a P-type sense amplifier PSA including P-type metal oxide semiconductor (PMOS) transistors, an N-type sense amplifier NSA including N-type metal oxide semiconductor (NMOS) transistors, a precharge and equivalent circuit EG including NMOS transistors, and column selection circuits CS operating in response to a column selection signal CSL.

The P-type sense amplifier PSA includes a first PMOS transistor P11 and a second PMOS transistor P12 connected in series between a bit line BL0 and a complementary bit line BLB0. The first sensing driving voltage line LA is connected to sources (e.g., source terminals) of the first and second PMOS transistors P11 and P12, the complementary bit line BLB0 is connected to a gate (e.g., gate terminal) of the first PMOS transistor P11, and the bit line BL0 is connected to a gate of the second PMOS transistor P12. Sizes of the first PMOS transistor P11 and the second PMOS transistor P12 may be different from each other. However, preferably, the sizes of the first PMOS transistor P11 and the second PMOS transistor P12 are the same as each other.

The first sensing driving voltage line LA is connected to the sensing-matching control circuit 130 (refer to FIG. 2) and supplies a first sensing driving voltage to the bit line sense amplifier S/A under control of the sensing-matching control circuit 130. The first sensing driving voltage of the bit line sense amplifier S/A may be a first internal voltage VINTA supplied to be used for an operation of the memory cell array 110 (refer to FIG. 1). The first internal voltage VINTA may be a voltage generated by a voltage generator in the memory device 100. The voltage generator may receive a power voltage VDD applied from the outside of the memory device 100 and may generate the first internal voltage VINTA having a lower level than the power voltage VDD.

In an embodiment, the P-type sense amplifier PSA connected to the first sensing driving voltage line LA supplies a high level of voltage (e.g., a first voltage), which is amplified in an operation of sensing and amplifying data of a memory cell connected to the bit line BL0.

The N-type sense amplifier NSA includes a first NMOS transistor N11 and a second NMOS transistor N12 connected in series between the bit line BL0 and the complementary bit line BLB0. The second sensing driving voltage line LAB is connected to sources of the first and second NMOS transistors N11 and N12, the complementary bit line BLB0 is connected to a gate of the first NMOS transistor N11, and the bit line BL0 is connected to a gate of the second NMOS transistor N12. Sizes of the first NMOS transistor N11 and the second NMOS transistor N12 may be different from each other. However, preferably, the sizes of the first NMOS transistor N11 and the second NMOS transistor N12 are the same as each other.

The second sensing driving voltage line LAB is connected to the sensing-matching control circuit 130 and supplies a second sensing driving voltage to the bit line sense amplifier S/A under control of the sensing-matching control circuit 130. The second sensing driving voltage of the bit line sense amplifier S/A may be a second internal voltage VSS of the memory device 100. The second internal voltage VSS may be a ground voltage or a negative (−) voltage.

In an embodiment, the N-type sense amplifier NSA connected to the second sensing driving voltage line LAB supplies a low level of voltage (e.g., a second voltage less than the first voltage), which is amplified in the operation of sensing and amplifying data of the memory cell connected to the bit line BL0.

The precharge and equivalent circuit EQ may equalize the bit line BL0 and the complementary bit line BLB0 as a level of a precharge voltage VBL in response to an equalizing signal PEG. The precharge and equivalent circuit EQ includes a third NMOS transistor N13 connected between a node supplying the precharge voltage VBL and the bit line BL0, a fourth NMOS transistor N14 connected between a node supplying the precharge voltage VBL and the complementary bit line BLB0, and a fifth NMOS transistor N15 connected between the bit line BL and the complementary bit line BLB. According to an embodiment, the precharge and equivalent circuit EQ includes any one of the third and fourth NMOS transistors N13 and N14, and the fifth NMOS transistor N15.

Gates of the third through fifth NMOS transistors N13 through N15 are connected to a node providing the equalizing signal PEQ. The equalizing signal PEQ may be applied as a logic high level during a precharge operation of the bit line sense amplifier S/A so as to turn on the first through third NMOS transistors N13 through N15 and precharge the bit line BL0 and the complementary bit line BLB0 to the level of the precharge voltage VBL. During a sensing operation, the equalizing signal PEQ may be applied as a logic low level so as to turn off the first through third NMOS transistors N13 through N15.

The column selection circuits CS connect the bit line BL0 to a data input and output line IO0 and connect the complementary bit line BLB0 to a complementary data input and output line IOB0, in response to the column selection signal CSL. The column selection circuits CS may transfer a voltage level of the bit line BL0 and the complementary bit line BLB0, which is developed based on a voltage difference between the bit line BL0 and the complementary bit line BLB0 to the data input and output line IO0 and the complementary data input and output line IOB0 via a sensing operation of the P-type sense amplifier PSA and the N-type sense amplifier NSA. According to an embodiment, the column selection circuits CS are included in the input and output gating circuit 122 (refer to FIG. 1).

Figure 4:
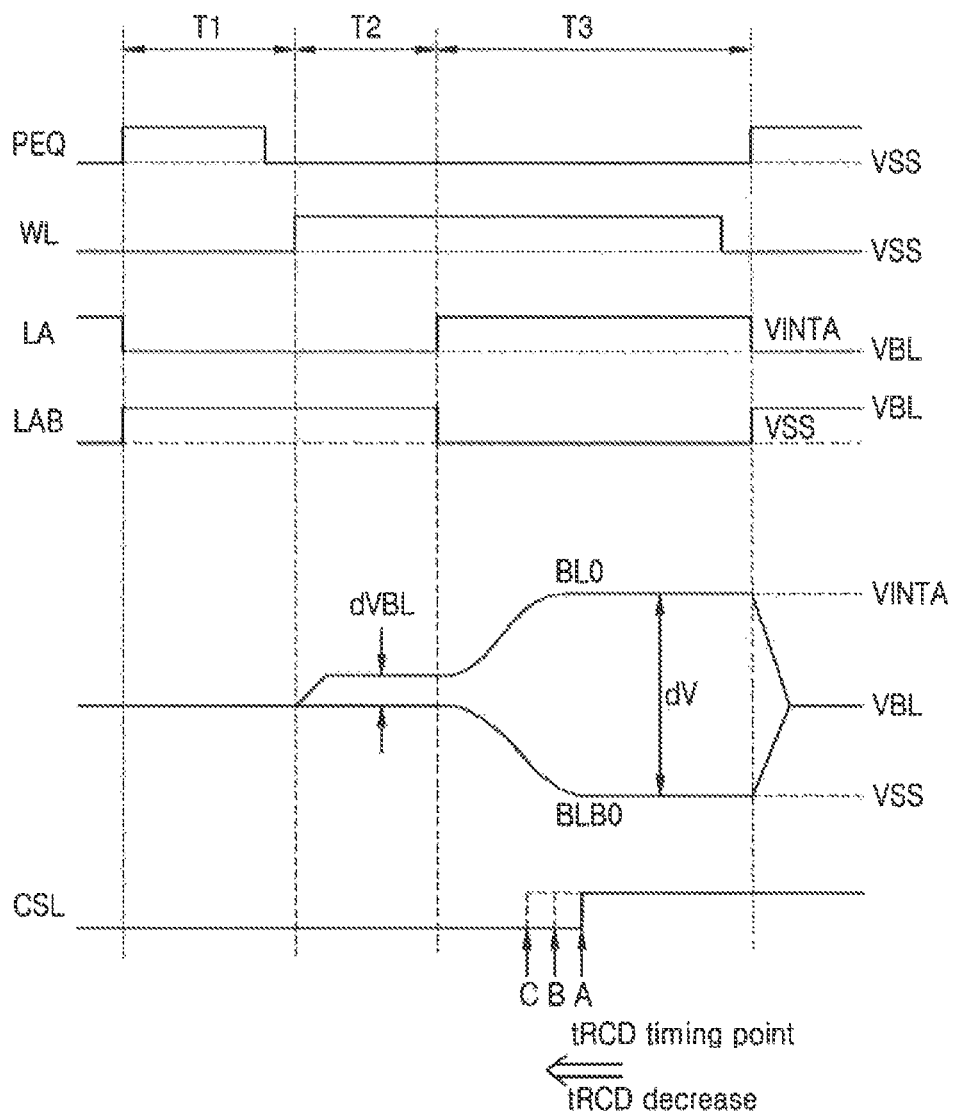
FIG. 4 is a timing diagram of an operation of a bit line sense amplifier of FIG. 3.

FIG. 4 is a timing diagram of the operation of the bit line sense amplifier S/A of FIG. 3. FIG. 4 illustrates an example of a case in which a logic state of data of the memory cell connected to the bit line BL0 is "1."

Referring to FIGS. 3 and 4, in a first section T1, the bit line sense amplifier S/A performs the precharge operation in response to the equalizing signal PEG of the logic high level, in order to precharge the pair of the bit line BL0 and the complementary bit line BLB0 to the precharge voltage VBL.

For example, the precharge voltage VBL may have a voltage level, corresponding to a half of a value obtained by summing a voltage level of the first sensing driving voltage line LA and a voltage level of the second sensing driving voltage line LAB. When the first internal voltage VINTA is applied to the first sensing driving voltage line LA and the second internal voltage VSS, which is the ground voltage, is applied to the second sensing driving voltage line LAB, the precharge voltage VBL has the voltage level corresponding to a half of the level of the first internal voltage VINTA. According to an embodiment, when the first internal voltage VINTA is applied to the first sensing driving voltage line LA and the second internal voltage VSS having a negative (−) value is applied to the second sensing driving voltage line LAB, the precharge voltage VBL has the voltage level corresponding to a half of a value obtained by summing the level of the first internal voltage VINTA and the level of the second internal voltage VSS having the negative (−) value.

In a second section T2, the word line WL of the memory cell connected to the bit line BL0 is activated from a logic low level to a logic high level, and the bit line sense amplifier S/A may perform a charge-sharing operation. The charge-sharing may occur between a charge stored in a cell capacitor of the memory cell connected to the bit line BL0 and a charge stored in the bit line BL0, and a voltage level of the bit line BL0 may be increased by a predetermined voltage level dVBL.

In a third section T3, the bit line sense amplifier S/A performs the sensing operation. Here, the first internal voltage VINTA is applied to the first sensing driving voltage line LA and the second internal voltage VSS is applied to the second sensing driving voltage line LAB. The bit line sense amplifier S/A increases the voltage level of the bit line BL0 to the first internal voltage VINTA and decreases the voltage level of the complementary bit line BLB0 to the second internal voltage VSS, based on the voltage difference dVBL between the bit line BL0 and the complementary bit line BLB0. The bit line sense amplifier S/A is driven based on the first internal voltage VINTA and the second internal voltage VSS and develops the voltage difference dVBL between the bit line BL0 and the complementary bit line BLB0 to an amplified voltage difference dV.

The described operation of the bit line sense amplifier S/A may be related to timing parameters of the memory device 100 (refer to FIG. 1). From among the timing parameters of the memory device 100, a tRCD (RAS-to-CAS delay) parameter may be closely related to the sensing operation of the bit line sense amplifier S/A in the third section T3.

In general, the tRCD parameter is a timing parameter indicating a minimum delay time when data written in a memory cell is read, and may be in part relate to the column selection signal CSL generated based on the column address strobe signal /CAS. As illustrated in FIG. 4, the voltage levels of the bit line BL0 and the complementary bit line BLB0, which are developed by the sensing operation of the bit line sense amplifier S/A, may be transferred to the data input and output line IO0 and the complementary data input and output line IOB0, in response to the column selection signal CSL. While the sensing operation of the bit line sense amplifier S/A is valid, a time point in which the column selection signal CSL is activated from logic low to logic high may be a tRCD time point A. Here, it may be assumed that the tRCD time point A in the operation of the bit line sense amplifier S/A satisfies a target tRCD parameter.

The PMOS transistors and/or the NMOS transistors included in the bit line sense amplifier S/A may have different device characteristics, for example, a different threshold voltage, due to process-voltage-temperature (PVT) variations. Thus, characteristics of the sensing operation of the bit line sense amplifier S/A, which is performed in the third section T3, may be degraded, and distribution of the sensing characteristics of the bit line sense amplifier S/A may be increased. In this case, the sensing operation in the tRCD time point A may become invalid. Accordingly, the target tRCD parameter of the memory device 100 may not be satisfied, and a yield rate of the memory device 100 may be decreased. To solve these problems, a method of constantly controlling the sensing operation of the bit line sense amplifier S/A is used in embodiments of the inventive concept.

Also, high speed operation of the memory device 100 requires that the target tRCD parameter be decreased. However, when the target tRCD parameter is decreased, the tRCD time point A may occur early at a time point B or a time point C during the sensing operation of the bit line sense amplifier S/A. In order to make the sensing operation of the bit line sense amplifier S/A valid even if the tRCD time point A occurs early, that is, in order to satisfy the target tRCD parameter, a method of constantly controlling the sensing operation of the bit line sense amplifier S/A is applied in embodiments of the inventive concept.

Figure 5:
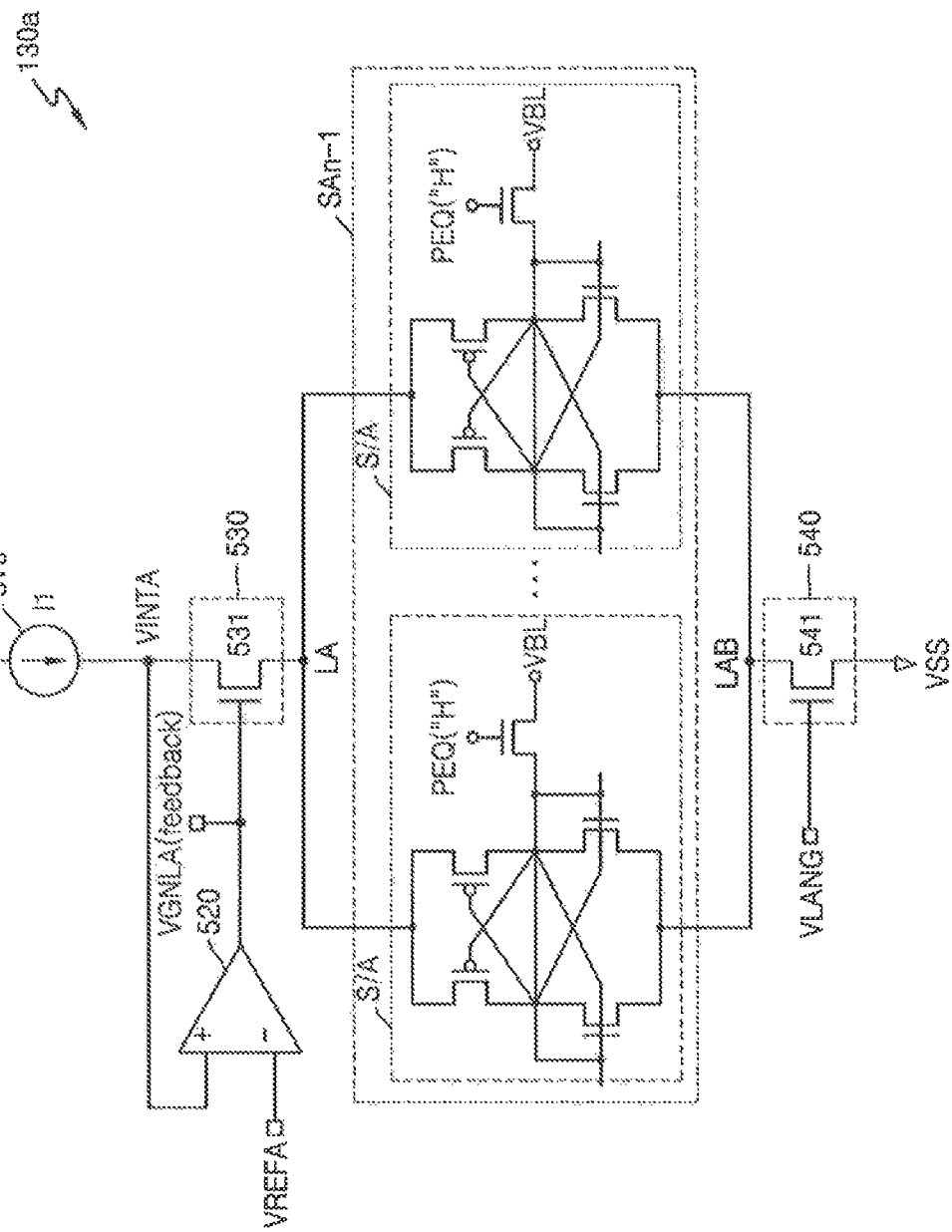
FIG. 5 is a diagram of a sensing-matching control circuit according to an exemplary embodiment of the inventive concept.

FIG. 5 is a diagram of a sensing-matching control circuit 130a according to an exemplary embodiment of the inventive concept that may be used to implement the sensing-matching control circuit of FIG. 1. In FIG. 5, the sensing-matching control circuit 130a may be connected to one or more of the plurality of bit line sense amplifier blocks SA0 through SAn illustrated in FIG. 2. For convenience of explanation, it is assumed that the sensing-matching control circuit 130a is connected to the bit line sense amplifier block SAn-1.

Referring to FIG. 5, the sensing-matching control circuit 130a is connected to the bit line sense amplifier block SAn-1 and is commonly connected to the bit line sense amplifiers S/A in the bit line sense amplifier block SAn-1. The sensing-matching control circuit 130a controls voltage levels of the first sensing driving voltage line LA and the second sensing driving voltage line LAB of the bit line sense amplifiers S/A in the bit line sense amplifier block SAn-1 to be constant.

Before an operation of the sensing-matching control circuit 130a, the bit line sense amplifiers S/A may perform the precharge operation of the section T1, described in FIG. 4. Accordingly, the pair of the bit line BL0 and the complementary bit line BLB0 may be precharged to the precharge voltage VBL.

The sensing-matching control circuit 130a includes a first current supply 510 (e.g., a current source), a first comparator 520 (e.g., an operational amplifier), a first sensing driving voltage driver 530 (e.g., a first sensing driving transistor), and a second sensing driving voltage driver 540 (e.g., a second sensing driving transistor).

The first current supply 510 supplies a first current I1 to a first internal voltage line. The first current I1 of the first current supply 510 is provided to the first sensing driving voltage driver 530 connected in series with the first current supply 510 and may operate as a bias current of the first sensing driving voltage driver 530. A level of the first internal voltage VINTA may be changed based on an amount of the first current I1 of the first current supply 510. For example, when the amount of the first current I1 of the first current supply 510 is relatively great, the level of the first internal voltage VINTA may be increased, and when the amount of the first current I1 of the first current supply 510 is relatively less, the level of the first internal voltage VINTA may be decreased.

The first comparator 520 compares the level of the first internal voltage VINTA with a level of a first reference voltage VREFA and generates the first sensing driving control signal VGNLA based on a result of the comparison. The first sensing driving control signal VGNLA is provided to the first sensing driving voltage driver 530.

The first sensing driving voltage driver 530 includes an NMOS transistor 531 connected between the first internal voltage line and the first sensing driving voltage line LA. The NMOS transistor 531 has a source, to which the first internal voltage VINTA is connected, a drain, to which the first sensing driving voltage line LA is connected, and a gate connected to an output of the comparator 520 which provides the first sensing driving control signal VGNLA.

The second sensing driving voltage driver 540 includes an NMOS transistor 541 connected between the second sensing driving voltage line LAB and a second internal voltage line. The NMOS transistor 541 has a source, to which the second internal voltage VSS is connected, a drain, to which the second sensing driving voltage line LAB is connected, and a gate, to which a node providing the second sensing driving control signal VLANG is connected. The second sensing driving control signal VLANG may be provided from the control logic 114 (refer to FIG. 1). For example, the second sensing driving control signal VLANG may be provided at a logic high level to turn on the NMOS transistor 541, so that the second sensing driving voltage line LAB is driven based on the second internal voltage VSS.

In the first comparator 520, when the level of the first internal voltage VINTA is higher than the level of the first reference voltage VREFA, the first sensing driving control signal VGNLA is generated as a logic high level and provided to the first sensing driving voltage driver 530. The NMOS transistor 531 of the first sensing driving voltage driver 530 is turned on in response to the first sensing driving control signal VGNLA of the logic high level and the first current I1 supplied from the first current supply 510 flows in the NMOS transistor 531. The level of the first internal voltage VINTA may be decreased due to the turned on NMOS transistor 531.

In the first comparator 520, when the level of the first internal voltage VINTA is lower than the level of the first reference voltage VREFA, the first sensing driving control signal VGNLA is generated at a logic low level and provided to the first sensing driving voltage driver 530. The NMOS transistor 531 of the first sensing driving voltage driver 530 is turned off in response to the first sensing driving control signal VGNLA of the logic low level. Accordingly, the level of the first internal voltage VINTA may be increased due to the first current I1 supplied from the first current supply 510 to the first internal voltage line.

The operations described above may be repeatedly performed via feedback until the level of the first internal voltage VINTA becomes equal to the level of the first reference voltage VREFA. In an embodiment, the sensing-matching control circuit 130a stores a value of a voltage level of the first sensing driving control signal VGNLA, when the level of the first internal voltage VINTA becomes equal to the level of the first reference voltage VREFA. The value of the voltage level of the first sensing driving control signal VGNLA may be stored and output by a voltage distributor 800 (refer to FIG. 8) illustrated in an example circuit diagram of FIG. 8.

In an embodiment, the output of the NMOS transistor 531 of FIG. 5 is connected to a node connected between the PMOS transistors P11 and P12 of FIG. 3. In an embodiment, the input of the NMOS transistor 541 in FIG. 5 is connected to a node connected between the NMOS transistors N11 and N12 of FIG. 3.

Figure 6:
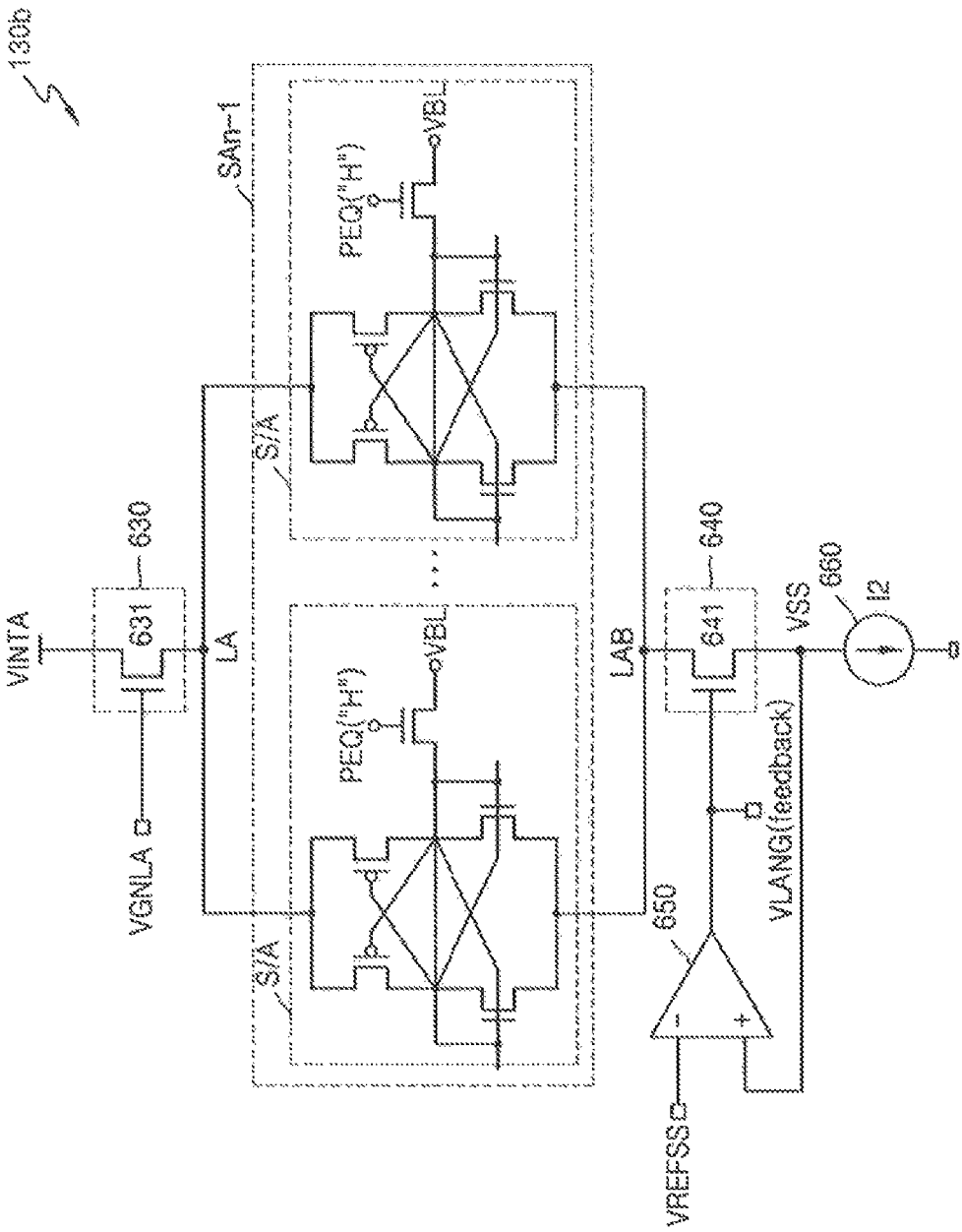
FIG. 6 is a diagram of a sensing-matching control circuit according to an exemplary embodiment of the inventive concept.

FIG. 6 is a diagram for describing a sensing-matching control circuit 130b according to an exemplary embodiment of the inventive concept that may be used to implement the sensing-matching control circuit 130 of FIG. 1.

Referring to FIG. 6, the sensing-matching control circuit 130b is connected to the bit line sense amplifier SAn–1 and is commonly connected to the bit line sense amplifiers S/A in the bit line sense amplifier block SAn–1. The sensing-matching control circuit 130b controls voltage levels of the first sensing driving voltage line LA and the second sensing driving voltage line LAB of the bit line sense amplifiers S/A in the bit line sense amplifier block SAn–1 to be constant.

Before an operation of the sensing-matching control circuit 130b, the bit line sense amplifiers S/A may perform the precharge operations of the section T1, described with reference to FIG. 4. Accordingly, the pair of the bit line BL0 and the complementary bit line BLB0 may be precharged to the precharge voltage VBL.

The sensing-matching control circuit 130b includes a first sensing driving voltage driver 630, a second sensing driving voltage driver 640, a second comparator 650, and a second current supply 660.

The first sensing driving voltage driver 630 includes an NMOS transistor 631 connected between the first internal voltage line and the first sensing driving voltage line LA. The NMOS transistor 631 has a source, to which a node providing the first internal voltage VINTA is connected, a drain, to which the first sensing driving voltage line LA is connected, and a gate connected to a node providing the first sensing driving control signal VGNLA.

The first sensing driving control signal VGNLA may be provided from the control logic 114. For example, the first sensing driving control signal VGNLA may be provided at a logic high level to turn on the NMOS transistor 631, so that the first sensing driving voltage line LA is driven based on the first internal voltage VINTA. According to an embodiment, the first sensing driving control signal VGNLA has the value of the voltage level of the first sensing driving control signal VGNLA, which is obtained via the feedback operation of the sensing-matching control circuit 130a, described with reference to FIG. 5.

The second sensing driving voltage driver 640 includes an NMOS transistor 641 connected between the second sensing driving voltage line LAB and the second internal voltage line. The NMOS transistor 641 has a source connected to a node providing the second internal voltage VSS, a drain, to which the second sensing driving voltage line LAB is connected, and a gate connected to a node providing the second sensing driving control signal VLANG.

The second comparator 650 compares a level of the second internal voltage VSS with a level of a second reference voltage VREFSS, and generates the second sensing driving control signal VLANG based on a result of the comparison. The second sensing driving control signal VLANG may be provided to the second sensing driving voltage driver 640.

The second current supply 660 is connected to the second internal voltage line and subtracts a second current I2 from the second internal voltage line. The second current I2 of the second current supply 660 may operate as a bias current of the second sensing driving voltage driver 640 connected in series with the second current supply 660. The level of the second internal voltage VSS may vary based on an amount of the second current I2 of the second current supply 660. For example, when the amount of the second current I2 of the second current supply 660 is relatively great, the level of the second internal voltage VSS may be decreased, and when the amount of the second current I2 of the second current supply 660 is relatively low, the level of the second internal voltage VSS may be increased.

In the second comparator 650, when the level of the second internal voltage VSS is higher than the level of the second reference voltage VREFSS, the second sensing driving control signal VLANG is generated at a logic low level and provided to the second sensing driving voltage driver 640. The NMOS transistor 641 of the second sensing driving voltage driver 640 is turned off in response to the second sensing driving control signal VLANG of the logic low level. Accordingly, the level of the second internal voltage VSS may be decreased due to the second current I2 of the second current supply 660.

In the second comparator 650, when the level of the second internal voltage VSS is lower than the level of the second reference voltage VREFSS, the second sensing driving control signal VLANG is generated at a logic high level and provided to the second sensing driving voltage driver 640. The NMOS transistor 641 of the second sensing driving voltage driver 640 is turned on in response to the second sensing driving control signal VLANG of the logic high level and the second current I2 of the second current supply 660 flows in the NMOS transistor 641. The level of the second internal voltage VSS may be increased due to the turned on NMOS transistor 641.

The operations described above may be repeatedly performed via feedback until the level of the second internal voltage VSS becomes equal to the level of the second reference voltage VREFSS. The sensing-matching control circuit 130b may store a value of a voltage level of the second sensing driving control signal VLANG when the level of the second internal voltage VSS becomes equal to the level of the second reference voltage VREFSS. The value of the voltage level of the second sensing driving control signal VLANG may be stored and output by the voltage distributor 800 illustrated in the example circuit diagram of FIG. 8.

In an embodiment, the output of the NMOS transistor 631 of FIG. 6 is connected to a node connected between the PMOS transistors P11 and P12 of FIG. 3. In an embodiment, the input of the NMOS transistor 641 in FIG. 6 is connected to a node connected between the NMOS transistors N11 and N12 of FIG. 3.

Figure 7:
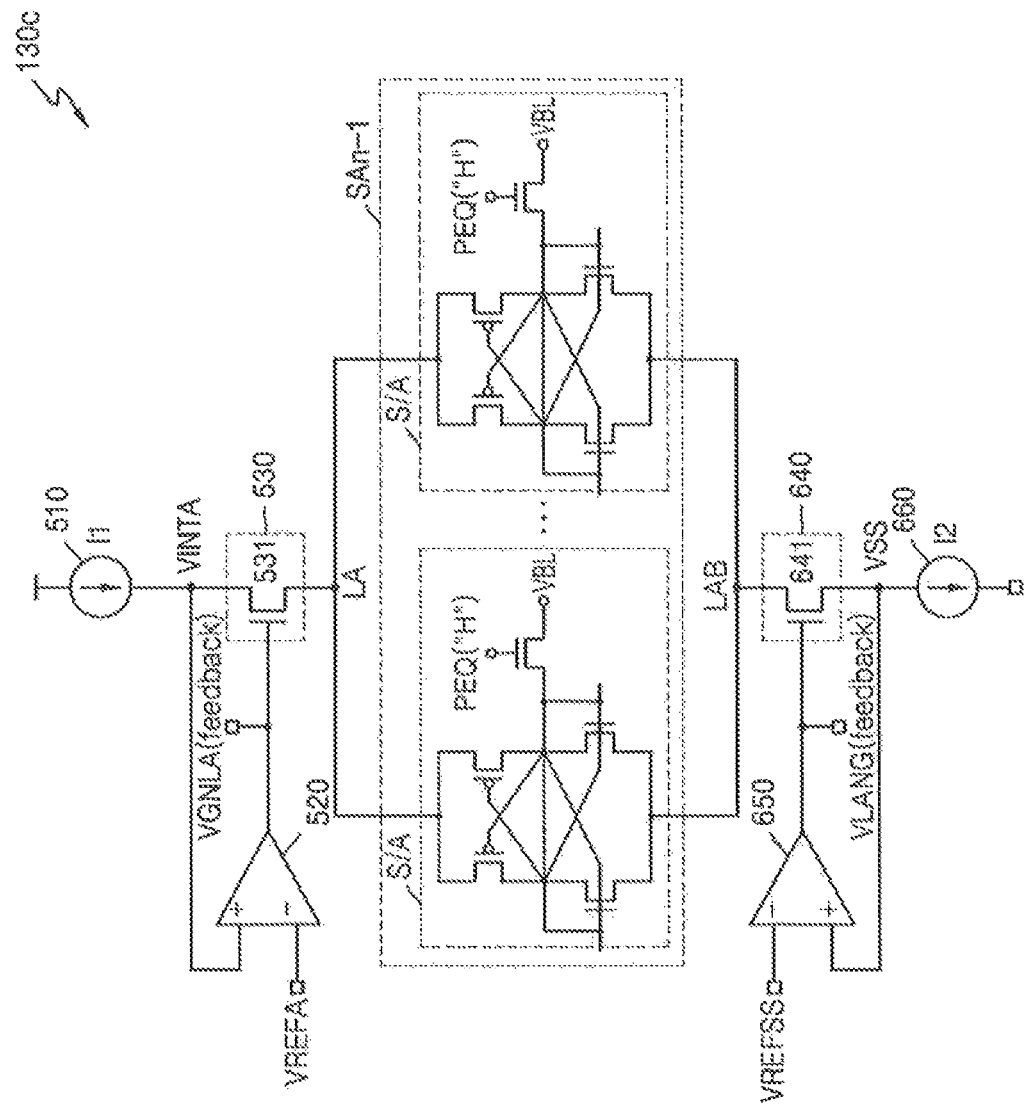
FIG. 7 is a diagram of a sensing-matching control circuit according to an exemplary embodiment of the inventive concept.

FIG. 7 is a diagram for describing a sensing-matching control circuit 130c according to an exemplary embodiment of the inventive concept that may be used to implement the sensing-matching control circuit 130c of FIG. 1.

Referring to FIG. 7, as compared with the sensing-matching control circuit 130a of FIG. 5, the sensing-matching control circuit 130c has the same structure except the second sensing driving voltage driver 540 is replaced with the second sensing driving voltage driver 640, the second comparator 650, and the second current supply 660 described with reference to FIG. 6. Hereinafter, the same descriptions will not be repeated.

The sensing-matching control circuit 130c may repeatedly perform a feedback operation whereby the level of the first internal voltage VINTA becomes equal to the level of the first reference voltage VREFA, by using the first current supply 510, the first comparator 520, and the first sensing driving voltage driver 530. The sensing-matching control circuit 130c may store the value of the voltage level of the first sensing driving control signal VGNLA when the level of the first internal voltage VINTA becomes equal to the level of the first reference voltage VREFA.

The sensing-matching control circuit 130c may repeatedly perform a feedback operation whereby the level of the second internal voltage VSS becomes equal to the level of the second reference voltage VREFSS, by using the second sensing driving voltage driver 640, the second comparator 650, and the second current supply 660. The sensing-matching control circuit 130c may store the value of the voltage level of the second sensing driving control signal VLANG when the level of the second internal voltage VSS becomes equal to the level of the second reference voltage VREFSS.

Figure 8:
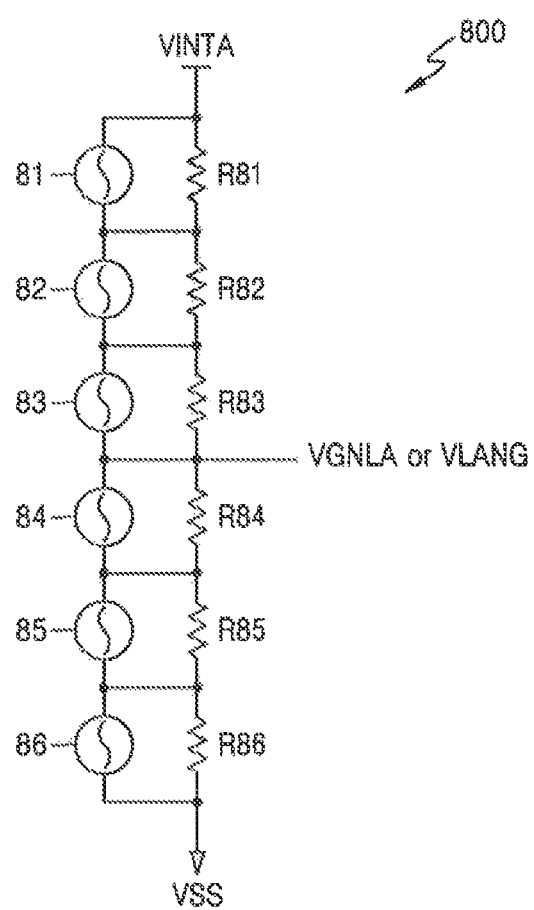
FIG. 8 is a circuit diagram for describing a voltage distributor according to an exemplary embodiment of the inventive concept.

The values of the voltage levels of the first and second sensing driving control signals VGNLA and VLANG of the sensing-matching control circuit 130c may be stored and output by the voltage distributor 800 illustrated in the example circuit diagram of FIG. 8.

In an embodiment, the output of the NMOS transistor 531 of FIG. 7 is connected to a node connected between the PMOS transistors P11 and P12 of FIG. 3. In an embodiment, the input of the NMOS transistor 641 in FIG. 7 is connected to a node connected between the NMOS transistors N11 and N12 of FIG. 3.

FIG. 8 is a circuit diagram of the voltage distributor 800 according to an exemplary embodiment of the inventive concept. The voltage distributor 800 of FIG. 8 may be included in the sensing-matching control circuits 130a through 130c described with reference to FIGS. 5 through 7.

Referring to FIG. 8, the voltage distributor 800 includes a plurality of resistors R81 through R86 connected in series and a plurality of fuses 81 through 86 connected in parallel to the plurality of resistors R81 through R86, respectively. The fuses 81 through 86 are connected in series with one another. The plurality of resistors R81 through R86 may be connected between a node providing the first internal voltage VINT and a node providing the second internal voltage VSS. According to an embodiment, the plurality of resistors R81 through R86 are connected between other voltages, rather than the first and second internal voltages VINTA and VSS.

The plurality of fuses 81 through 86 may be cut or connected by an operator, before the bit line sense amplifiers S/A are activated, for example, during a process of manufacturing the memory device 100 (refer to FIG. 1). The fuses 81 through 86 may be selectively cut based on the value of the voltage level of the first sensing driving control signal VGNLA, obtained by the repeated feedback operations by using the first current supply 510, the first comparator 520, and the first sensing driving voltage driver 530, in the sensing-matching control circuits 130a and 130c of FIGS. 5 and 7. The voltage level of the first sensing driving control signal VGNLA may be determined based on whether or not the fuses 81 through 86 are cut. When the voltage level of the first sensing driving control signal VGNLA is determined, the sensing-matching control circuits 130a and 130c may control the first current supply 510 and the first comparator 520 not to operate any more. In an embodiment, the first sensing driving control signal VGNLA is output from the voltage distributor 800 to the gate of the NMOS transistor 531 and not output by the comparator 520 (e.g., comparator 520 is powered down).

Likewise, the fuses 81 through 86 may be selectively cut based on the value of the voltage level of the second sensing driving control signal VLANG, obtained by the repeated feedback operations by using the second sensing driving voltage driver 640, the second comparator 650, and the second current supply 660, in the sensing-matching control circuits 130b and 130c of FIGS. 6 and 7. The voltage level of the second sensing driving control signal VLANG may be determined based on whether or not the fuses 81 through 86 are cut. When the voltage level of the second sensing driving control signal VLANG is determined, the sensing-matching control circuits 130b and 130c may control the second current supply 660 and the second comparator 650 not to operate any more. In an embodiment, the second sensing driving control signal VLANG is output from the voltage distributor 800 to the gate of the NMOS transistor 641 and not output by the comparator 650 (e.g., comparator 650 is powered down).

The value(s) of the voltage level(s) of the first sensing driving control signal VGNLA and/or the second sensing driving control signal VLANG, output by the voltage distributor 800, may be directly applied to the gate of the NMOS transistor 531 of the first sensing driving voltage driver 530 and/or the gate of the NMOS transistor 641 of the second sensing driving voltage driver 640. A constant level of current may be supplied to the first sensing voltage driving line LA from the first internal voltage VINTA via the NMOS transistor 531 of the first sensing driving voltage driver 530. A constant level of current may be supplied to the second sensing voltage driving line LAB from the second internal voltage VSS via the NMOS transistor 641 of the second sensing driving voltage driver 640.

In an embodiment, the bit line sense amplifier S/A (refer to FIG. 3) constantly performs the sensing operation within a predetermined range, based on the constant levels of currents supplied to the first sensing driving voltage line LA and the second sensing driving voltage line LAB. Accordingly, distribution of sensing characteristics of the bit line sense amplifier S/A may be decreased. In an embodiment, the range is a voltage range.

Figure 9:
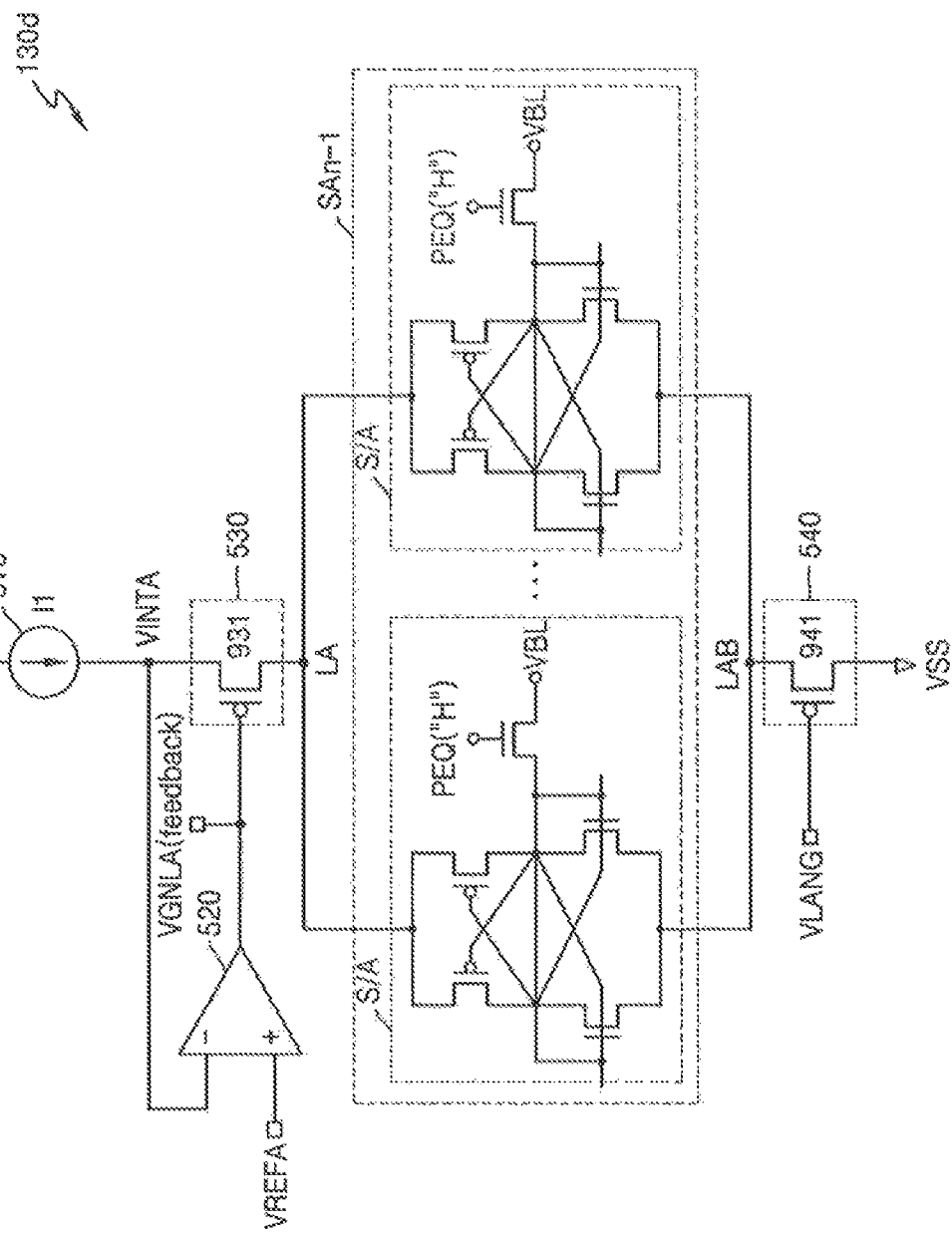
FIG. 9 is a diagram of a sensing-matching control circuit according to an exemplary embodiment of the inventive concept.

FIG. 9 is a diagram of a sensing-matching control circuit 130d according to an exemplary embodiment of the inventive concept that can be used to implement the sensing-matching circuit 130 of FIG. 1.

Referring to FIG. 9, as compared with the sensing-matching control circuit 130a of FIG. 5, the sensing-matching control circuit 130d has the same structure except the NMOS transistors 531 and 541 of the first and second sensing driving voltage drivers 530 and 540 are replaced with PMOS transistors 931 and 941, and a polarity of the first comparator 520 is the opposite. Hereinafter, the same descriptions will not be repeated.

The first sensing driving voltage driver 530 includes the PMOS transistor 931 connected between the first internal voltage line and the first sensing driving voltage line LA. The second sensing driving voltage driver 540 includes the PMOS transistor 941 connected between the second sensing driving voltage line LAB and the second internal voltage line.

In the first comparator 520, when the level of the first internal voltage VINTA is higher than the level of the first reference voltage VREFA, the first sensing driving control signal VGNLA is generated at a logic low level and provided to the first sensing driving voltage driver 530. The PMOS transistor 931 of the first sensing driving voltage driver 530 is turned on in response to the first sensing driving control signal VGNLA of the logic low level and the first current I1 supplied from the first current supply 510 flows in the PMOS transistor 931. The level of the first internal voltage VINTA may be decreased due to the turned on PMOS transistor 931.

In the first comparator 520, when the level of the first internal voltage VINTA is lower than the level of the first reference voltage VREFA, the first sensing driving control signal VGNLA is generated at a logic high level and provided to the first sensing driving voltage driver 530. The PMOS transistor 931 of the first sensing driving voltage driver 530 is turned off in response to the first sensing driving control signal VGNLA of the logic high level. Accordingly, the level of the first internal voltage VINTA may be increased due to the first current I1 supplied to the first internal voltage line from the first current supply 510.

The sensing-matching control circuit 130d may repeatedly perform a feedback operation until the level of the first internal voltage VINTA becomes equal to the level of the first reference voltage VREFA, and may store the value of the voltage level of the first sensing driving control signal VGNLA when the level of the first internal voltage VINTA becomes equal to the level of the first reference voltage VREFA.

In an embodiment, the output of the PMOS transistor 931 of FIG. 9 is connected to a node connected between the PMOS transistors P11 and P12 of FIG. 3. In an embodiment, the input of the PMOS transistor 941 in FIG. 9 is connected to a node connected between the NMOS transistors N11 and N12 of FIG. 3.

Figure 10:
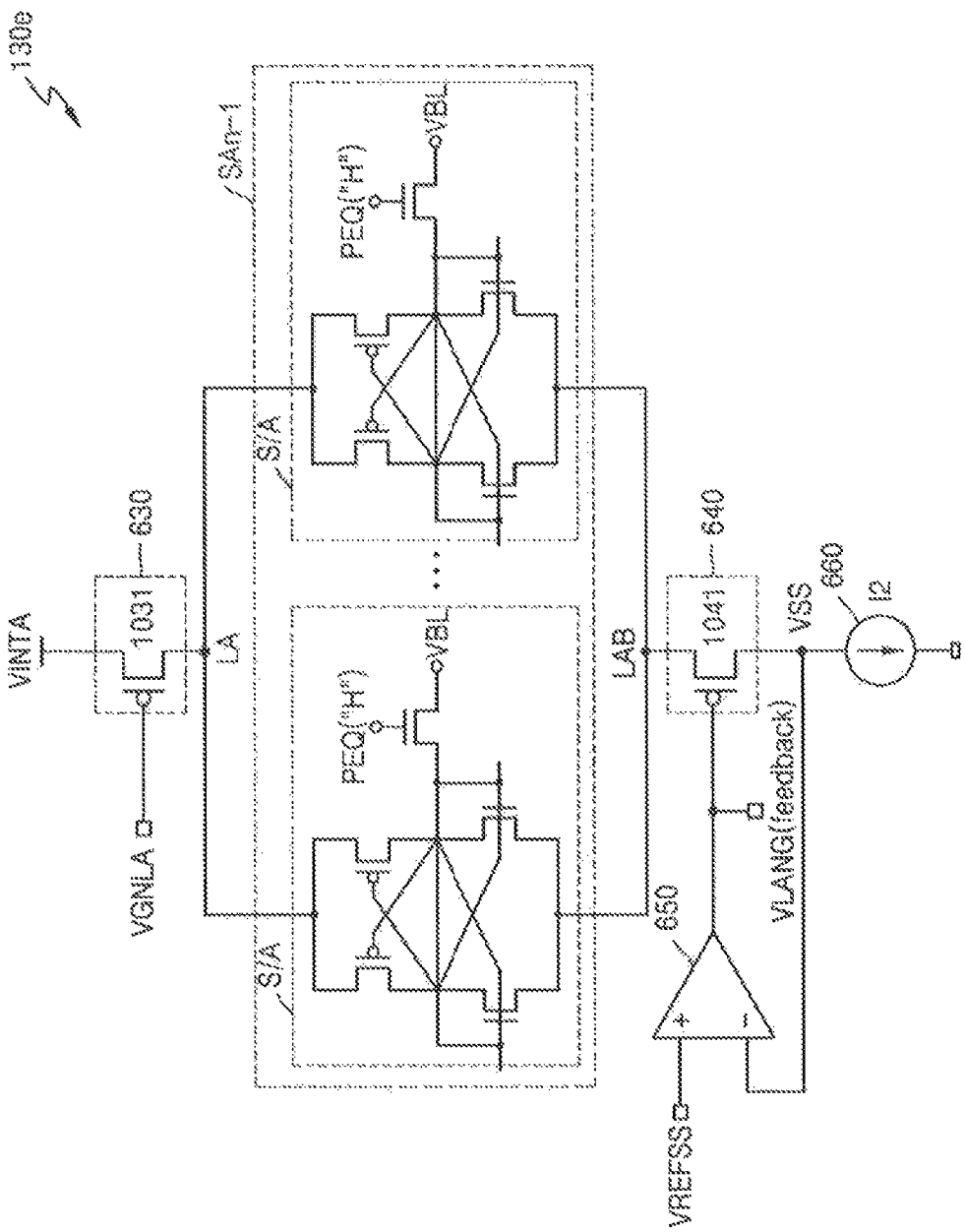
FIG. 10 is a diagram of a sensing-matching control circuit according to an exemplary embodiment of the inventive concept.

FIG. 10 is a diagram of a sensing-matching control circuit 130e according to an exemplary embodiment of the inventive concept that can be used to implement the sensing-matching circuit 130 of FIG. 1.

Referring to FIG. 10, as compared with the sensing-matching control circuit 130b of FIG. 6, the sensing-matching control circuit 130e has the same structure except the NMOS transistors 631 and 641 of the first and second sensing driving voltage drivers 630 and 640 are replaced with PMOS transistors 1031 and 1041, and a polarity of the second comparator 650 is the opposite. Hereinafter, the same descriptions will not be repeated.

The first sensing driving voltage driver 630 includes the PMOS transistor 1031 connected between the first internal voltage line and the first sensing driving voltage line LA. The second sensing driving voltage driver 640 includes the PMOS transistor 1041 connected between the second sensing driving voltage line LAB and the second internal voltage line.

In the second comparator 650, when the level of the second internal voltage VSS is higher than the level of the second reference voltage VREFSS, the second sensing driving control signal VLANG is generated at a logic high level and provided to the second sensing driving voltage driver 640. The PMOS transistor 1041 of the second sensing driving voltage driver 640 is turned off in response to the second sensing driving control signal VLANG of the logic high level. Accordingly, the level of the second internal voltage VSS may be decreased due to the second current I2 of the second current supply 660.

In the second comparator 650, when the level of the second internal voltage VSS is lower than the level of the second reference voltage VREFSS, the second sensing driving control signal VLANG is generated at a logic low level and provided to the second sensing driving voltage driver 640. The PMOS transistor 1041 of the second sensing driving voltage driver 640 is turned on in response to the second sensing driving control signal VLANG of the logic low level, and the second current I2 of the second current supply 660 flows in the PMOS transistor 1041. The level of the second internal voltage VSS may be increased due to the turned on PMOS transistor 1041.

The sensing-matching control circuit 130e may repeatedly perform a feedback operation until the level of the second internal voltage VSS becomes equal to the level of the second reference voltage VREFSS, and may store the value of the voltage level of the second sensing driving control signal VLANG when the level of the second internal voltage VSS becomes equal to the level of the second reference voltage VREFSS.

In an embodiment, the output of the PMOS transistor 1031 of FIG. 10 is connected to a node connected between the PMOS transistors P11 and P12 of FIG. 3. In an embodiment, the input of the PMOS transistor 1041 in FIG. 10 is connected to a node connected between the NMOS transistors N11 and N12 of FIG. 3.

Figure 11:
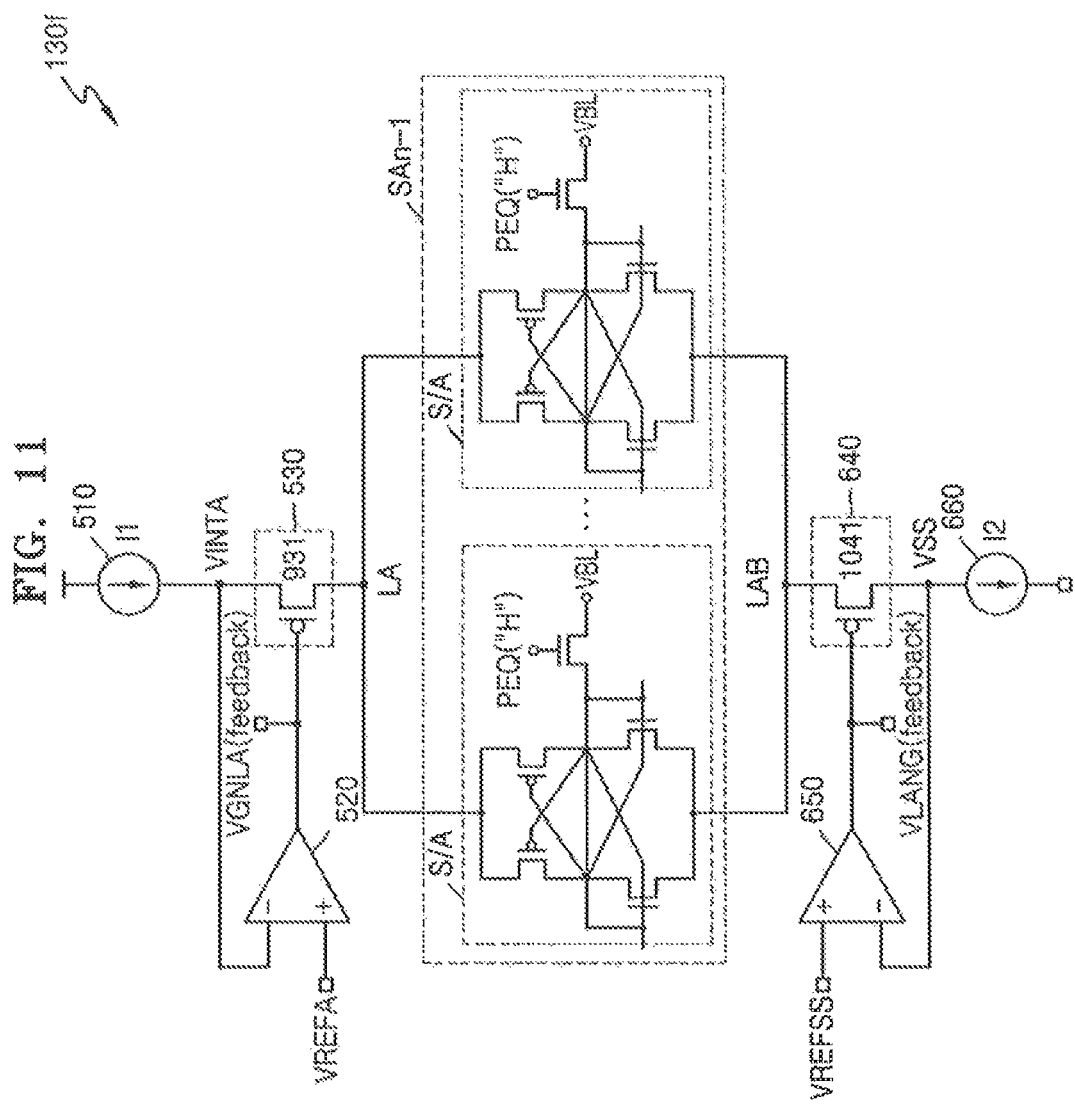
FIG. 11 is a diagram of a sensing-matching control circuit according to an exemplary embodiment of the inventive concept.

FIG. 11 is a diagram of a sensing-matching control circuit 130f according to an exemplary embodiment of the inventive concept that may be used to implement the sensing-matching control circuit 130 of FIG. 1.

Referring to FIG. 11, as compared with the sensing-matching control circuit 130c of FIG. 7, the sensing-matching control circuit 130f has the same structure except the NMOS transistors 531 and 641 of the first and second sensing driving voltage drivers 530 and 640 are replaced with PMOS transistors, and polarities of the first and second comparators 520 and 650 are the opposite. Hereinafter, the same descriptions will not be repeated.

The sensing-matching control circuit 130f may repeatedly perform a feedback operation whereby the level of the first internal voltage VINTA becomes equal to the level of the first reference voltage VREFA, by using the first current supply 510, the first comparator 520, and the first sensing driving voltage driver 530. The sensing-matching control circuit 130f may store the value of the voltage level of the first sensing driving control signal VGNLA when the level of the first internal voltage VINTA becomes equal to the level of the first reference voltage VREFA.

The sensing-matching control circuit 130f may repeatedly perform a feedback operation whereby the level of the second internal voltage VSS becomes equal to the level of the second reference voltage VREFSS, by using the second sensing driving voltage driver 640, the second comparator 650, and the second current supply 660. The sensing-matching control circuit 130f may store the value of the voltage level of the second sensing driving control signal VLANG when the level of the second internal voltage VSS becomes equal to the level of the second reference voltage VREFSS.

In an embodiment, the output of the PMOS transistor 931 of FIG. 11 is connected to a node connected between the PMOS transistors P11 and P12 of FIG. 3. In an embodiment, the input of the PMOS transistor 1041 in FIG. 11 is connected to a node connected between the NMOS transistors N11 and N12 of FIG. 3.

Figure 12:
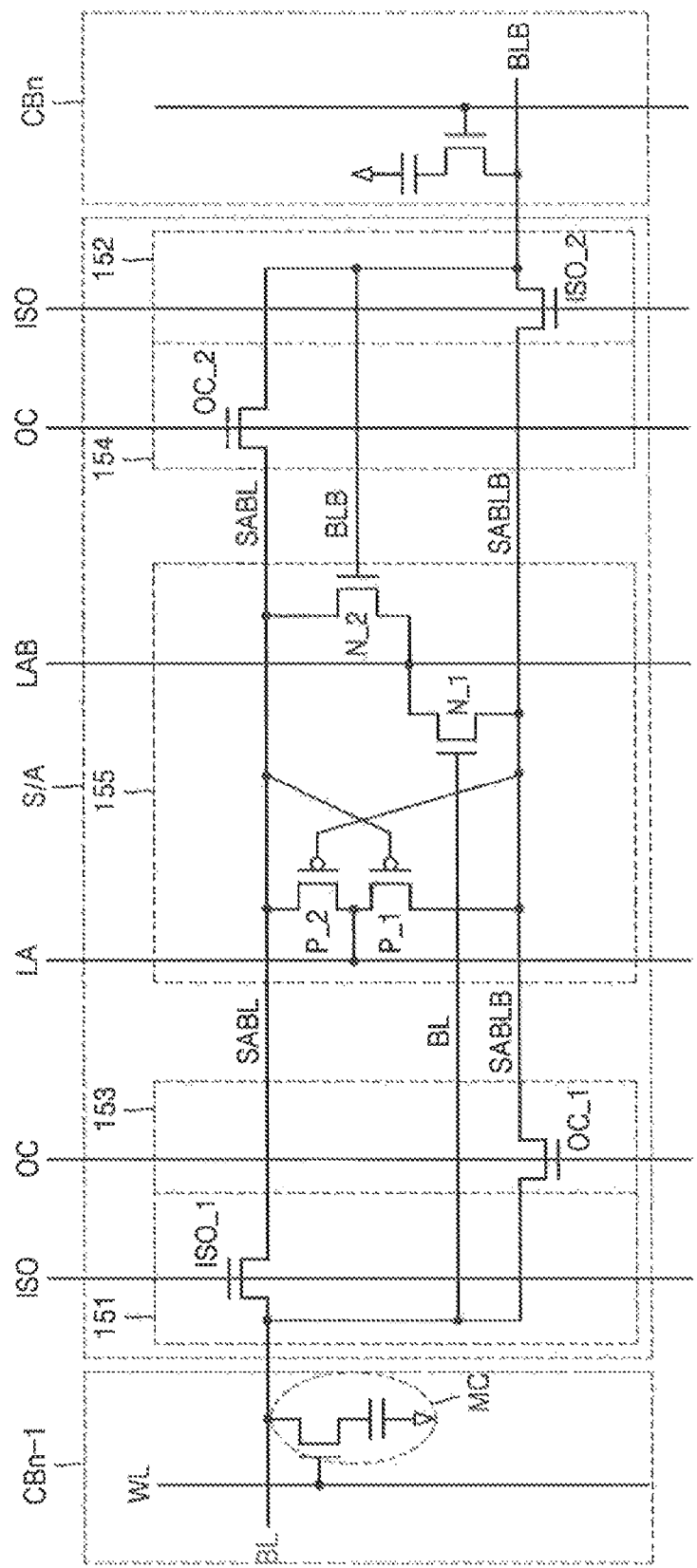
FIG. 12 is a diagram of circuits included in another example of the bit line sense amplifier of FIG. 2.

FIG. 12 is a diagram of circuits included in another example of the bit line sense amplifiers S/A illustrated in FIG. 2.

Referring to FIG. 12, the bit line sense amplifier S/A include first and second isolators 151 and 152, first and second offset removers 153 and 154, and a sense amplifier 155.

The first isolator 151 is connected between the bit line BL and a sensing bit line SABL, and the second isolator 152 is connected between the complementary bit line BLB and a complementary sensing bit line SABLB. The first and second isolators 151 and 152 receive an isolation signal ISO and operate in response to the isolation signal ISO.

The first isolator 151 includes a first isolation transistor ISO_1 connecting or blocking between the bit line BL and the sensing bit line SABL in response to the isolation signal ISO. An end of the first isolation transistor ISO_1 is connected to the bit line BL, the other end of the first isolation transistor ISO_1 is connected to the sensing bit line SABL, and a gate of the first isolation transistor ISO_1 is connected to the isolation signal ISO. Thus, the first isolator 151 can be used to connect the bit line BL to the sensing bit line SABL or disconnect the bit line BL from the sensing bit line SABL.

The second isolator 152 includes a second isolation transistor ISO_2 connecting or blocking between the complementary bit line BLB and the complementary sensing bit line SABLB in response to the isolation signal ISO. An end of the second isolation transistor ISO_2 is connected to the complementary bit line BLB, the other end of the second isolation transistor ISO_2 is connected to the complementary sensing bit line SABLB, and a gate of the second isolation transistor ISO_2 may be connected to the isolation signal ISO. Thus, the second isolator 152 can be used to connect the complementary bit line BLB to the complementary sensing bit line SABLB or disconnect the complementary bit line BLB from the complementary sensing bit line SABLB.

The first offset remover 153 is connected between the bit line BL and the complementary sensing bit line SABLB, and the second offset remover 154 is connected between the complementary bit line BLB and the sensing bit line SABL. The first and second offset removers 153 and 154 receive an offset removal signal OC and operate in response to the offset removal signal OC.

The first offset remover 153 includes a first offset removal transistor OC_1 connecting or blocking between the bit line BL and the complementary sensing bit line SABLB in response to the offset removal signal OC. An end of the first offset removal transistor OC_1 is connected to the bit line BL, the other end of the first offset removal transistor OC_1 is connected to the complementary sensing bit line SABLB, and a gate of the first offset removal transistor OC_1 is connected to the offset removal signal OC. Thus, the first offset removal transistor OC_1 can be used to connect the bit line BL to the complementary sensing bit line SABLB or disconnect the bit line BL from the complementary sensing bit line SABLB.

The second offset remover 154 includes a second offset removal transistor OC_2 connecting or blocking between the complementary bit line BLB and the sensing bit line SABL in response to the offset removal signal OC. An end of the second offset removal transistor OC_2 is connected to the complementary bit line BLB, the other end of the second offset removal transistor OC_2 is connected to the sensing bit line SABL, and a gate of the second offset removal transistor OC_2 is connected to the offset removal signal OC. Thus, the second offset removal transistor OC_2 can connect the complementary bit line BLB to the sensing bit line SABL or disconnect the complementary bit line BLC from the sensing bit line SABL.

The sense amplifier 155 is connected between the sensing bit line SABL and the complementary sensing bit line SABLB, and senses and amplifies a voltage difference between the bit line BL and the complementary bit line BLB based on the first and second control signals LA and LAB.

The sense amplifier 155 includes first and second PMOS transistors P_1 and P_2 and first and second NMOS transistors N_1 and N_2.

An end of the first PMOS transistor P_1 is connected to the complementary sensing bit line SABLB, the other end of the first PMOS transistor P_1 is connected to the first sensing driving voltage line LA, and a gate of the first PMOS transistor P_1 is connected to the sensing bit line SABL. An end of the second PMOS transistor P_2 is connected to the sensing bit line SABL, the other end of the second PMOS transistor P_2 is connected to the first sensing driving voltage line LA, and a gate of the second PMOS transistor P_2 is connected to the complementary sensing bit line SABLB.

An end of the first NMOS transistor N_1 is connected to the complementary sensing bit line SABLB, the other end of the first NMOS transistor N_1 is connected to the second sensing driving voltage line LAB, and a gate of the first NMOS transistor N_1 is connected to the bit line BL. An end of the second NMOS transistor N_2 is connected to the sensing bit line SABL, the other end of the second NMOS transistor N_2 is connected to the second sensing driving voltage line LAB, and a gate of the second NMOS transistor N_2 is connected to the complementary bit line BLB.

Figure 13:
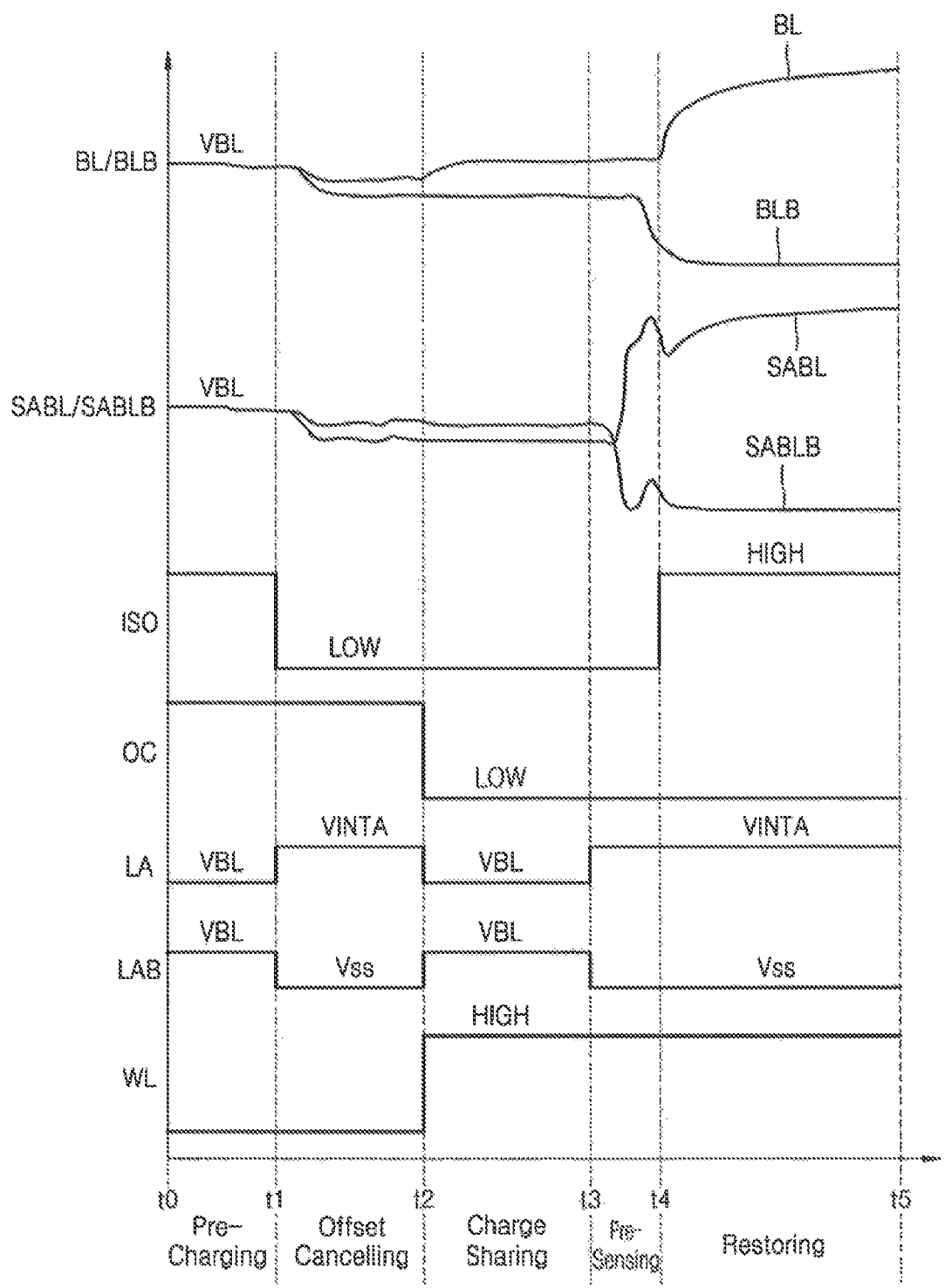
FIGS. 13 and 14 are diagrams for describing an operation of the bit line sense amplifier of FIG. 12.
Figure 14:
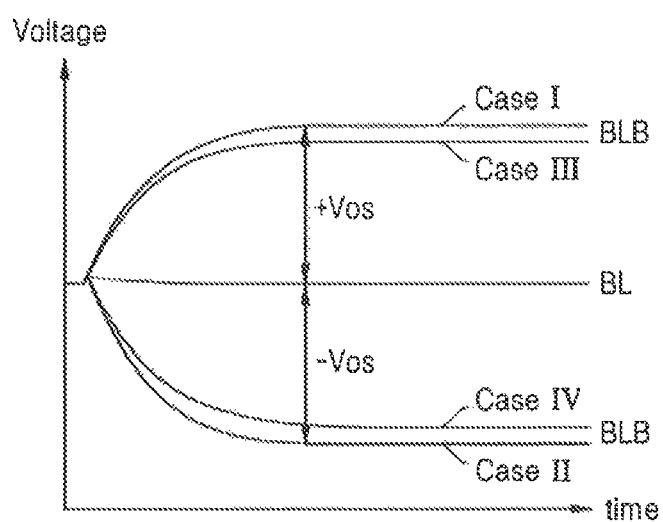

FIGS. 13 and 14 are diagrams for describing an operation of the bit line sense amplifier S/A of FIG. 12. In the timing diagram of FIG. 13, an x axis indicates time and a y axis indicates a signal level. For example, it is assumed that the memory cell MC stores data "1."

Referring to FIG. 13, the bit line sense amplifier S/A sequentially performs a precharge operation, an offset removal operation, a charge-sharing operation, a pre-sensing operation, and a re-storing operation.

In a first section t0-t1, the bit line sense amplifier S/A performs the precharge operation. Here, the isolation signal ISO and the offset removal signal OC are logic high H and a pair of the bit line BL and the complementary bit line BLB and a pair of the sensing bit line SABL and the complementary sensing bit line SABLB are precharged to the precharge voltage VBL.

In a second section t1-t2, the bit line sense amplifier S/A performs the offset removal operation. Here, the isolation signal ISO becomes logic low L. The first sensing driving voltage line LA is increased from the precharge voltage VBL to the first internal voltage VINTA, and the second sensing driving voltage line LAB is decreased from the precharge voltage VBL to the second internal voltage VSS.

The first and second isolation transistors ISO_1 and ISO_2 of the bit line sense amplifier S/A are turned off in response to the isolation signal ISO of logic low L, and the first and second offset removal transistors OC_1 and OC_2 of the bit line sense amplifier S/A are turned on in response to the offset removal signal OC of logic high H. Here, the first sensing driving voltage line LA transitions from the precharge voltage VBL to the first internal voltage VINTA, and the second sensing driving voltage line LAB transitions from the precharge voltage VBL to the second internal voltage VSS. Thereafter, the first sensing driving voltage line LA transitions from the first internal voltage VINTA to the precharge voltage VBL, and the second sensing driving voltage line LAB transitions from the second internal voltage VSS to the precharge voltage VBL.

In the bit line sense amplifier S/A, for example, the first and second PMOS transistors P_1 and P_2 and the first and second NMOS transistors N_1 and N_2 may have different threshold voltages Vth due to PVT. In this case, offset noise may be generated in the bit line sense amplifier S/A, due to differences in the threshold voltages Vth between the first and second PMOS transistors P_1 and P_2 and the first and second NMOS transistors N_1 and N_2. Hereinafter, a method of compensating for an offset in the bit line sense amplifier S/A via the offset removal operation will be described, based on first through fourth examples.

As the first example Case I, it is assumed that the threshold voltage Vth of the first NMOS transistor N_1 is higher than the threshold voltage Vth of the second NMOS transistor N_2. The first and second NMOS transistors N_1 and N_2 may operate as diodes. A current flowing through the first NMOS transistor N_1 may be less than a current flowing through the second NMOS transistor N_2. Also, a current flowing through the first PMOS transistor P_1 may be less than a current flowing through the second PMOS transistor P_2. Accordingly, the complementary bit line BLB may be increased to a predetermined level, as compared to the bit line BL illustrated in FIG. 14.

As the second example Case II, it is assumed that the threshold voltage Vth of the second NMOS transistor N_2 is higher than the threshold voltage Vth of the first NMOS transistor N_1. The first and second NMOS transistors N_1 and N_2 may operate as diodes. A current flowing through the second NMOS transistor N_2 may be less than a current flowing through the first NMOS transistor N_1. Also, a current flowing through the second PMOS transistor P_2 may be less than a current flowing through the first PMOS transistor P_1. Accordingly, the complementary bit line BLB may be decreased to a predetermined level, as compared to the bit line BL illustrated in FIG. 14.

As the third example Case III, it is assumed that the threshold voltage Vth of the first PMOS transistor P_1 is higher than the threshold voltage Vth of the second PMOS transistor P_2. A current flowing through the first PMOS transistor P_1 may be less than a current flowing through the second PMOS transistor P_2. The first and second NMOS transistors N_1 and N_2 may discharge a predetermined amount of current as diodes. Accordingly, the complementary bit line BLB may be increased to a predetermined level, as compared to the bit line BL illustrated in FIG. 14.

As the fourth example Case IV, it is assumed that the threshold voltage Vth of the second PMOS transistor P_2 is higher than the threshold voltage Vth of the first PMOS transistor P_1. A current flowing through the second PMOS transistor P_2 may be less than a current flowing through the first PMOS transistor P_1. The first and second NMOS transistors N_1 and N_2 may discharge a predetermined amount of current as diodes. Accordingly, the complementary bit line BLB may be decreased to a predetermined level, as compared to the bit line BL illustrated in FIG. 14.

In the first through fourth Cases I through IV described above, the voltage of the complementary bit line BLB may be increased or decreased to the predetermined level as compared to the bit line BL, so that the bit line BL and the complementary bit line BLB has a predetermined voltage difference. This voltage difference may be interpreted as an offset voltage due to offset noise. This denotes that the bit line BL and the complementary bit line BLB are arranged such that the bit line BL and the complementary bit line BLB have a voltage difference corresponding to the offset voltage, so that the offset noise of the bit line sense amplifier S/A is removed. That is, the bit line sense amplifier S/A may compensate the offset by the offset removal operation.

In a third section t2-t3, the bit line sense amplifier S/A performs the charge-sharing operation. Here, the isolation signal ISO and the offset removal signal OC become logic low L, the word line WL connected to the memory cell MC is activated, and charge-sharing occurs between a charge stored in a cell capacitor of the memory cell MC and a charge stored in the bit line BL. When the data "1" is stored in the memory cell MC, a voltage level of the bit line BL may be increased to a predetermined level during the charge-sharing operation. According to another embodiment, when data "0" is stored in the memory cell MC, the voltage level of the bit line BL may be decreased to a predetermined level during the charge-sharing operation.

In a fourth section t3-t4, the bit line sense amplifier S/A performs the pre-sensing operation. Here, the first sensing driving voltage line LA transitions to the first internal voltage VINTA and the second sensing driving voltage line LAB transitions to the second internal voltage VSS. Accordingly, the bit line sense amplifier S/A may increase the sensing bit line SABL to the first internal voltage VINTA and may decrease the complementary sensing bit line SABLB to the second internal voltage VSS, based on a voltage difference between the bit line BL and the complementary bit line BLB.

In a fifth section t4-t5, the bit line sense amplifier S/A performs the re-storing operation. Here, the isolation signal ISO becomes logic high H to turn on the first and second isolation transistors ISO_1 and ISO_2. The pair of the bit line BL and the complementary bit line BLB and the pair of the sensing bit line SABL and the complementary sensing bit line SABLB may be connected, and the pair of the bit line BL and the complementary bit line BLB may be charged or discharged to a voltage level of the pair of the sensing bit line SABL and the complementary sensing bit line SABLB.

Figure 15:
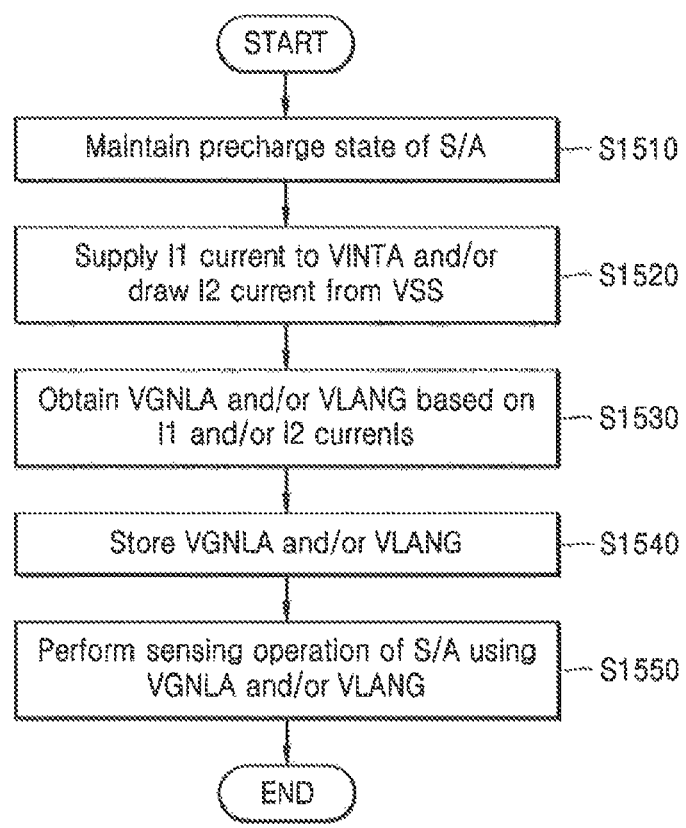
FIG. 15 is a flowchart of a method of constantly controlling sensing operations of bit line sense amplifiers, according to an exemplary embodiment of the inventive concept.

FIG. 15 is a flowchart of a method of constantly controlling sensing operations of the bit line sense amplifiers S/A, according to an exemplary embodiment of the inventive concept. The method of FIG. 15 may be performed by the bit line sense amplifiers S/A and the sensing-matching control circuits 130a through 130f described with reference to FIGS. 3 through 14.

Referring to FIG. 15, in operation S1510, the bit line BL and the complementary bit line BLB connected to the bit line sense amplifiers S/A is precharged and maintained at the pre-charged state. The bit line sense amplifier S/A of FIG. 3 may precharge the bit line BL and the complementary bit line BLB to the precharge voltage VBL in response to the equalizing signal PEQ of logic high in the first section T1 of FIG. 4. Alternatively, the bit line sense amplifier S/A of FIG. 13 may precharge the pair of the bit line BL and the complementary bit line BLB and the pair of the sensing bit line SABL and the complementary sensing bit line SABLB to the precharge voltage VBL in response to the isolation signal ISO and the offset removal signal OC of logic high in the first section t0-t1 of FIG. 14.

In operation S1520, an operation of supplying the first current I1 to the first internal voltage line by using the first current source 530 or an operation of subtracting the second current I2 from the second internal voltage line by using the second current source 640 is performed.

In operation S1530, the level of the voltage of the first internal voltage line and the level of the first reference voltage VREFA are compared (e.g., see comparator 520 in FIG. 5). Based on a result of the comparison, when the level of the voltage of the first internal voltage line and the level of the first reference voltage VREFA are equal to each other, the first sensing driving control signal VGNLA is generated. A level of current supplied to the first sensing driving voltage line LA may be determined based on the first sensing driving control signal VGNLA.

The level of the voltage of the second internal voltage line and the level of the second reference voltage VREFSS are compared (e.g., see comparator 650 in FIG. 6). Based on a result of the comparison, when the level of the voltage of the second internal voltage line and the level of the second reference voltage VREFSS are equal to each other, the second sensing driving control signal VLANG is generated. A level of current supplied to the second sensing driving voltage line LAB may be determined based on the second sensing driving control signal VLANG.

In operation S1540, before the sensing operations of the bit line sense amplifiers S/A, the first and/or the second sensing driving control signals VGNLA and/or VLANG are stored in the voltage distributor 800 of FIG. 8. Based on whether or not the fuses 81 through 86 in the voltage distributor 800 are cut, the first sensing driving control signal VGNLA and/or the second sensing driving control signal VLANG are stored.

In operation S1550, the first internal voltage line and the first sensing driving voltage line LA are connected to each other in response to the first sensing driving control signal VGNLA and the second internal voltage line and the second sensing driving voltage line LAB are connected to each other in response to the second sensing driving control signal VLANG, wherein the first and second driving control signals VGNLA and VLANG are stored in the voltage distributor 800.

The first and second sensing driving control signals VGNLA and VLANG may control levels of currents respectively supplied to the first sensing driving voltage line LA and the second sensing driving voltage line LAB driving the bit line sense amplifiers S/A, to be constant. Accordingly, the sensing operations or the offset removal operations of the bit line sense amplifiers S/A of FIGS. 3 and 12 may become constant. Also, even if device characteristics of the bit line sense amplifiers S/A vary, since the bit line sense amplifiers S/A are constantly driven based on the constant levels of currents respectively supplied to the first and second sensing driving voltage lines LA and LAB, distribution of sensing characteristics or distribution of offset removal of the bit line sense amplifiers S/A may be reduced.

While the inventive concept has been particularly shown and described with reference to embodiments thereof, it will be understood that various changes in form and details may be made therein without departing from the spirit and scope of the inventive concept.

What is claimed is:

1. A memory device comprising:
    a plurality of memory cell blocks, where each memory cell block comprises a plurality of memory cells;
    a plurality of bit line sense amplifier blocks arranged between the memory cell blocks and comprising bit line sense amplifiers performing sensing operations for sensing and amplifying data of the memory cells; and
    a sensing-matching control circuit connected to one or more of the bit line sense amplifier blocks and determining levels of currents respectively supplied to a first sensing driving voltage line and a second sensing driving voltage line, wherein the first sensing driving voltage line and the second sensing driving voltage line are connected to the bit line sense amplifiers of the one or more bit line sense amplifier blocks, to which the sensing-matching control circuit is connected,
    wherein the bit line sense amplifiers of the one or more bit line sense amplifier blocks are driven based on the levels of currents of the first and second sensing driving voltage lines, the levels of currents being determined by the sensing-matching control circuit,
    wherein the sensing-matching control circuit applies a first internal voltage to a given sensing driving voltage line among the sensing driving voltage lines during one of the sensing operations, and
    wherein the sensing-matching control circuit comprises:
        a first current source;
        a first sensing driving voltage driver; and
        a first comparator comparing a first internal voltage of a first node connected between the first current source and an input terminal of the first sensing driving voltage driver with a first reference voltage to output a first sensing driving control signal,
        wherein the first sensing driving voltage driver provides the first internal voltage to the given sensing driving voltage line based on the first sensing driving control signal.

2. The memory device of claim 1, wherein the sensing-matching control circuit comprises a voltage distributor comprising resistors connected in series and fuses connected in parallel to the resistors, wherein
    the voltage distributor stores the first sensing driving control signal based on whether or not the fuses are cut, and
    the levels of currents respectively supplied to the first and second sensing driving voltage lines are determined in response to the first sensing driving control signal.

3. The memory device of claim 2, wherein the sensing-matching control circuit stores the first sensing driving control signal in the voltage distributor, before the sensing operations of the bit line sense amplifiers.

4. The memory device of claim 3, wherein the first sensing driving control signal is stored in the voltage distributor in a process of manufacturing the memory device.

5. The memory device of claim 1, wherein the first sensing driving voltage driver comprises an NMOS transistor comprising a gate terminal receiving the first sensing driving control signal, and connected between the first node and the given sensing driving voltage line.

6. The memory device of claim 1, wherein the first sensing driving voltage driver comprises a PMOS transistor comprising a gate terminal receiving first sensing driving control signal, and connected between the first node and the given sensing driving voltage line.

7. The memory device of claim 1, wherein the sensing-matching control circuit comprises:
    a second current source;
    a second sensing driving voltage driver; and
    a second comparator comparing a second internal voltage of a second node connected between the second current source and the second sensing driving voltage driver with a second reference voltage to generate a second sensing driving control signal,
    wherein the second sensing driving voltage driver provides the second internal voltage to the other sensing driving voltage line based on the second sensing driving control signal.

8. The memory device of claim 7, wherein the first sensing driving voltage driver comprises a first NMOS transistor comprising a gate receiving the first sensing driving control signal, and connected between the first node and the given sensing driving voltage line, and
    the second sensing driving voltage driver comprises a second NMOS transistor comprising a gate receiving the second sensing driving control signal, and connected between the second node and the other sensing driving voltage line.

9. The memory device of claim 7, wherein the first sensing driving voltage driver comprises a first PMOS transistor comprising a gate receiving the first sensing driving control signal, and connected between the first node and the given sensing driving voltage line, and the second sensing driving voltage driver comprises a second PMOS transistor comprising a gate receiving the second sensing driving control signal, and connected between the second node and the other sensing driving voltage line.

10. The memory device of claim 1, wherein each of the bit line sense amplifiers comprises:

P-type sense amplifier sensing and amplifying a voltage difference between a bit line and a complementary bit line, to which the memory cells are connected, and supplying a high level of the amplified voltage difference, in the sensing operations;

an N-type sense amplifier sensing and amplifying the voltage difference between the bit line and the complementary bit line, to which the memory cells are connected, and supplying a low level of the amplified voltage difference, in the sensing operations; and a precharge and equivalent circuit equalizing the bit line and the complementary bit line to a level of a precharge voltage, before the sensing operations.

11. The memory device of claim 1, wherein the sensing-matching control circuit decreases the first internal voltage when the first internal voltage is higher than the first reference voltage and increases the first internal voltage when the first internal voltage is lower than the first reference voltage.

12. A memory device comprising:

a plurality of memory cell blocks, where each memory cell block comprises a plurality of memory cells;

a plurality of bit line sense amplifier blocks arranged between the memory cell blocks and comprising bit line sense amplifiers performing operations of removing an offset voltage between a bit line and a complementary bit line, to which the memory cells are connected, and sensing and amplifying a voltage difference between the bit line and the complementary bit line; and a sensing-matching control circuit connected to one or more of the bit line sense amplifier blocks and determining levels of currents respectively supplied to a first sensing driving voltage line and a second sensing driving voltage line, wherein the first sensing driving voltage line and the second sensing driving voltage line are connected to the bit line sense amplifiers of the one or more bit line sense amplifier blocks, to which the sensing-matching control circuit is connected, wherein the bit line sense amplifiers of the one or more bit line sense amplifier blocks are driven based on the levels of currents of the first and second sensing driving voltage lines, the levels of currents being determined by the sensing-matching control circuit, wherein the sensing-matching control circuit comprises a current source, a comparator, and a transistor connected between the current source and one of the sensing driving voltage lines, wherein the comparator receives a voltage of a node connected between the current source and an input terminal of the transistor and a reference voltage, and provides an output to a gate terminal of the transistor.

13. The memory device of claim 12, wherein the sensing-matching control circuit comprises a voltage distributor comprising resistors connected in series and fuses connected in parallel to the resistors, wherein the voltage distributor stores a sensing driving control signal based on whether or not the fuses are cut, and the levels of currents respectively supplied to the first and second sensing driving voltage lines are determined in response to the sensing driving control signal.

14. The memory device of claim 13, wherein the sensing-matching control circuit stores the sensing driving control signal in the voltage distributor, before the operations of removing the offset voltage via the bit line sense amplifiers.

15. The memory device of claim 12, wherein the sensing-matching control circuit compares a level of a voltage of a first internal voltage line with a level of a first reference voltage, generates a sensing driving control signal when the level of the voltage of the first internal voltage line is equal to the level of the first reference voltage, and drives the first sensing driving voltage line based on the determined level of current of the first sensing driving voltage line, in response to the sensing driving control signal.

16. The memory device of claim 12, wherein the sensing-matching control circuit compares a level of a voltage of a first internal voltage line with a level of a first reference voltage, generates a sensing driving control signal when the level of the voltage of the second internal voltage line is equal to the level of the first reference voltage, and drives the second sensing driving voltage line based on the determined level of current of the second sensing driving voltage line, in response to the sensing driving control signal.

17. The memory device of claim 12, wherein each of the bit line sense amplifiers comprises:

a first isolation transistor connecting the bit line with a sensing bit line in response to an isolation signal;

a first offset removal transistor connecting the bit line with a complementary sensing bit line in response to an offset removal signal;

a P-type sense amplifier supplying a high level of the amplified voltage difference in sensing operations;

an N-type sense amplifier supplying a low level of the amplified voltage difference in the sensing operations;

a second isolation transistor connecting the complementary bit line with the complementary sensing bit line in response to the isolation signal; and a second offset removal transistor connecting the complementary bit line with the sensing bit line in response to the offset removal signal.

* * * * *